(12) United States Patent
Shao et al.

(10) Patent No.: US 12,389,589 B2
(45) Date of Patent: Aug. 12, 2025

(54) SEMICONDUCTOR DEVICE AND METHOD FOR MANUFACTURING SEMICONDUCTOR DEVICE

(71) Applicant: CHANGXIN MEMORY TECHNOLOGIES, INC., Hefei (CN)

(72) Inventors: Guangsu Shao, Hefei (CN); Deyuan Xiao, Hefei (CN); Weiping Bai, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 545 days.

(21) Appl. No.: 17/939,054

(22) Filed: Sep. 7, 2022

(65) Prior Publication Data

US 2023/0005918 A1  Jan. 5, 2023

Related U.S. Application Data

(63) Continuation of application No. PCT/CN2022/094055, filed on May 20, 2022.

(30) Foreign Application Priority Data

Apr. 22, 2022  (CN) .......................... 202210429923.3

(51) Int. Cl.
*H10B 12/10*  (2023.01)
*H10B 12/00*  (2023.01)
*H10D 30/67*  (2025.01)

(52) U.S. Cl.
CPC ............. *H10B 12/30* (2023.02); *H10B 12/03* (2023.02); *H10B 12/482* (2023.02); *H10B 12/488* (2023.02); *H10D 30/6735* (2025.01); *H10D 30/6755* (2025.01)

(58) Field of Classification Search
CPC ...... H10B 12/03; H10B 12/30; H10B 12/482; H10B 12/488; H10D 30/6735; H10D 30/6755
USPC .......................................... 257/43
See application file for complete search history.

(56) References Cited

U.S. PATENT DOCUMENTS

| 8,198,149 B2 * | 6/2012 | Sun ........................ H10F 39/182 |
| | | 438/164 |
| 11,335,685 B2 | 5/2022 | Son et al. |
| 2015/0214231 A1 * | 7/2015 | Lee ..................... H10B 12/0335 |
| | | 257/296 |
| 2023/0269932 A1 * | 8/2023 | Sukekawa .............. H10B 12/50 |
| | | 257/296 |

FOREIGN PATENT DOCUMENTS

CN  111863825 A  10/2020

* cited by examiner

*Primary Examiner* — Monica D Harrison
(74) *Attorney, Agent, or Firm* — Syncoda LLC; Feng Ma

(57) ABSTRACT

A semiconductor device and a method for manufacturing a semiconductor device are provided. The semiconductor device includes a substrate, and a plurality of storage structures stacked on the substrate. Each of the plurality of storage structures includes: a first dielectric layer; at least one channel layer arranged in the first dielectric layer and extending in a first direction, the first dielectric layer being provided with a plurality of first grooves isolating the at least one channel layer; and a capacitor structure covering a sidewall and a bottom surface of each of the plurality of first grooves.

19 Claims, 17 Drawing Sheets

SEMICONDUCTOR DEVICE AND METHOD FOR MANUFACTURING SEMICONDUCTOR DEVICE

CROSS-REFERENCE TO RELATED APPLICATIONS

This is a continuation application of International Patent Application No. PCT/CN2022/094055, filed on May 20, 2022, which claims priority to Chinese Patent Application No. 202210429923.3, filed on Apr. 22, 2022 and entitled "SEMICONDUCTOR DEVICE AND METHOD FOR MANUFACTURING SEMICONDUCTOR DEVICE". The disclosures of International Patent Application No. PCT/CN2022/094055 and Chinese Patent Application No. 202210429923.3 are incorporated by reference herein in their entireties.

BACKGROUND

A semiconductor device including capacitors, such as a Dynamic Random Access Memory (DRAM), is typically formed from a single-layer memory cell. The memory cell generally includes a transistor and a capacitor pillar. The transistor is arranged in a substrate, and the capacitor pillar is arranged on the substrate.

However, with the increasing demands for integration and data storage density of various electronic devices, it is increasingly difficult for conventional two-dimensional semiconductor devices to meet the demands.

SUMMARY

The disclosure relates to the field of semiconductor manufacturing, and in particular to a semiconductor device and a method for manufacturing a semiconductor device.

An embodiment of the disclosure provides a semiconductor device, including:
 a substrate, and a plurality of storage structures stacked on the substrate.

Each of the plurality of storage structures includes: a first dielectric layer; at least one channel layer arranged in the first dielectric layer and extending in a first direction, the first dielectric layer being provided with a plurality of first grooves isolating the at least one channel layer; and a capacitor structure covering a sidewall and a bottom surface of each of the plurality of first grooves.

An embodiment of the disclosure further provides a method for manufacturing a semiconductor device, which includes the following operations.

A substrate is provided.

A storage structure is formed on the substrate. The operation that the storage structure is formed on the substrate includes the following operations. A first dielectric layer is formed. At least one channel layer extending in a first direction is formed in the first dielectric layer. A plurality of first grooves isolating the at least one channel layer are formed in the first dielectric layer. A capacitor structure covering a sidewall and a bottom surface of each of the plurality of first grooves is formed.

One or more other storage structures are stacked on said storage structure.

The details of one or more embodiments of the disclosure are set forth in the accompanying drawings and the description below. Other features and advantages of the disclosure will be apparent from the description, the accompanying drawings, and the claims.

BRIEF DESCRIPTION OF THE DRAWINGS

In order to describe the technical solutions in embodiments of the disclosure more clearly, the accompanying drawings required to be used in the embodiments will be simply introduced below. It is apparent that the accompanying drawings in the following description show merely some embodiments of the disclosure, and persons of ordinarily skill in the art may still derive other drawings from these accompanying drawings without inventive effort.

DETAILED DESCRIPTION

Figure 1A:
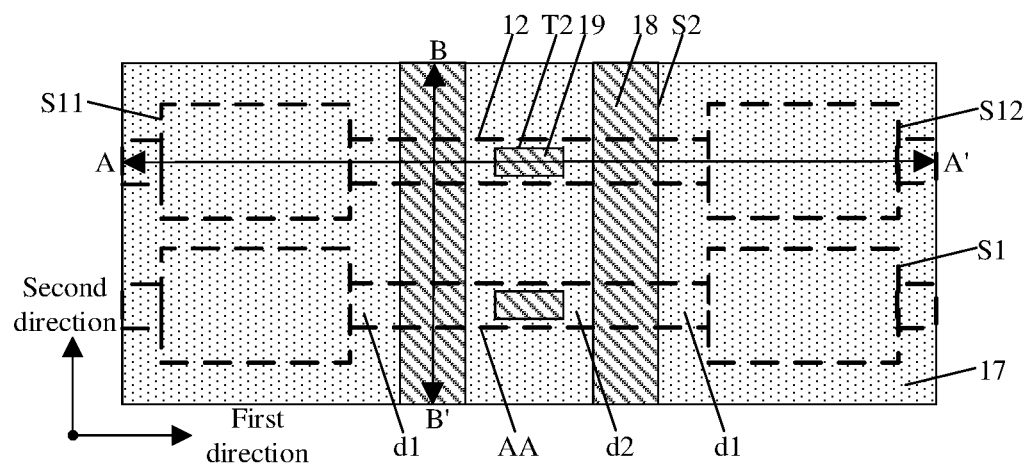
FIG. 1A to FIG. 1C are schematic diagrams of a semiconductor device according to an embodiment of the disclosure.

Exemplary implementations of the disclosure will be described in more detail below with reference to the accompanying drawings. Although the exemplary implementations of the disclosure are shown in the accompanying drawings, it should be understood that the disclosure may be implemented in various forms and cannot be limited by specific implementations illustrated herein. On the contrary, these implementations are provided to more thoroughly understand the disclosure and to completely convey the scope of the disclosure to those skilled in the art.

In the following description, numerous specific details are set forth to provide a more thorough understanding of the disclosure. However, it will be apparent to those skilled in the art that the disclosure may be implemented without one or more of these details. In other examples, in order to avoid confusion with the disclosure, some technical features known in the art are not described. That is, all the features of the actual embodiments are not described here, and the well-known functions and structures are not described in detail.

In the accompanying drawings, the sizes and relative size of layers, regions, and elements may be exaggerated for clarity. The same reference numerals denote the same elements throughout the disclosure.

It should be understood that when an element or layer is described as being "on", "adjacent to", "connected to" or "coupled to" another element or layer, it may be directly on, adjacent to, connected to, or coupled to the other element or layer, or there can be an intermediate element or layer. In contrast, when an element is described as being "directly on", "directly adjacent to", "directly connected to" or "directly coupled to" another element or layer, there is no the intermediate element or layer. It should be understood that although the terms "first", "second", "third" and the like may be used to describe various elements, components, regions, layers, and/or portions, these elements, components, regions, layers, and/or portions should not be limited by these terms. These terms are used merely to distinguish an element, component, region, layer or portion from another element, component, region, layer or portion. Therefore, a first element, component, region, layer, or portion discussed below may be described as a second element, component, region, layer or portion without departing from the teachings of the disclosure. When the second element, component, region, layer or portion is discussed, it does not mean that the first element, component, region, layer or portion is necessarily present in the disclosure.

Spatial relation terms such as "below", "under", "lower", "beneath", "above", "on" and the like may be used herein for convenience of description to describe a relationship between an element or feature and another element or feature illustrated in the figures. It should be understood that, in addition to the orientations shown in the figures, the spatial relation terms are intended to include the different orientations of devices in use and operation. For example, if the devices in the figures are turned over, then the element or the feature described as "under" or "beneath" or "below" another element or feature would then be oriented as "above" the other element or feature. Therefore, the exemplary terms "under" and "below" may include both orientations of above and below. The device may be otherwise oriented (rotated by 90 degrees or in other orientations) and the spatial descriptions used herein are interpreted accordingly.

Terms used herein are for the purpose of describing the specific embodiments only and are not intended to be limiting of the disclosure. As used herein, "a/an", "one" and "said/the" in singular forms are also intended to include a plural form unless the context clearly indicates other forms. It should also be understood that the terms "consist" and/or "include" when used in the description, determine presence of the features, integers, steps, operations, elements and/or components, but do not exclude the presence or addition of one or more other features, integers, steps, operations, elements, components, and/or groups. As used herein, the term "and/or" includes any and all combinations of the related listed items.

A semiconductor device including capacitors, such as a DRAM, is typically formed from a single-layer memory cell. The memory cell generally includes a transistor and a capacitor pillar. The transistor is arranged in a substrate, and the capacitor pillar is arranged on the substrate. However, with the increasing demands for integration and data storage density of various electronic devices, it is increasingly difficult for conventional two-dimensional semiconductor devices to meet the demands. In addition, in the related art, the capacitor pillar tends to have a larger depth-to-width ratio, and thus the manufacturing process of the capacitor pillar is relatively complicated, and there are fewer capacitor pillars that can be accommodated per unit volume, so that the storage density of the semiconductor device is relatively low.

Based on this, the following technical solutions of the embodiments of the disclosure are provided.

An embodiment of the disclosure provides a semiconductor device. The semiconductor device includes a substrate, and a plurality of storage structures stacked on the substrate. Each of the plurality of storage structures includes: a first dielectric layer; at least one channel layer arranged in the first dielectric layer and extending in a first direction, the first dielectric layer being provided with a plurality of first grooves isolating the at least one channel layer; and a capacitor structure covering a sidewall and a bottom surface of each of the plurality of first grooves.

The semiconductor device provided by the embodiment of the disclosure includes a plurality of storage structures stacked on the substrate, which improves the integration and the storage density of the semiconductor device compared to a semiconductor device with a single-layer memory cell in the related art. Meanwhile, the capacitor structure provided by the embodiment of the disclosure covers the sidewall and the bottom surface of the first groove, so that the manufacturing process of the capacitor structure is simpler than a capacitor pillar with a high depth-to-width ratio in the related art.

The semiconductor device provided by the embodiment of the disclosure may be a DRAM, which is not limited thereto. The semiconductor device may also be any semiconductor device having a capacitor.

Specific implementations of the disclosure will be described in detail below with reference to the accompanying drawings. When the embodiments of the disclosure are described in detail, for convenience for description, a schematic diagram may be partially enlarged not according to a general scale, and the schematic diagram is only an example, and should not limit the protection scope of the disclosure herein.

Figure 1B:
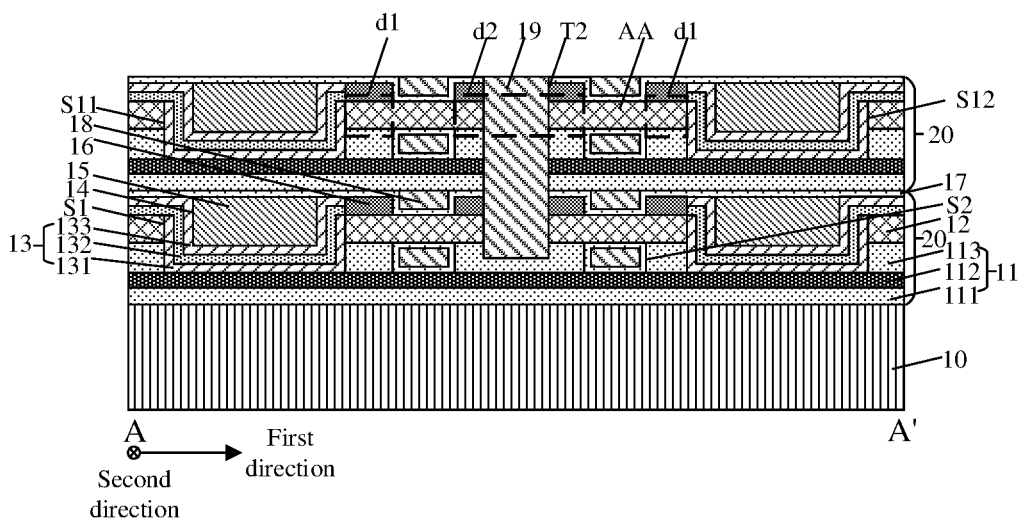
Figure 1C:
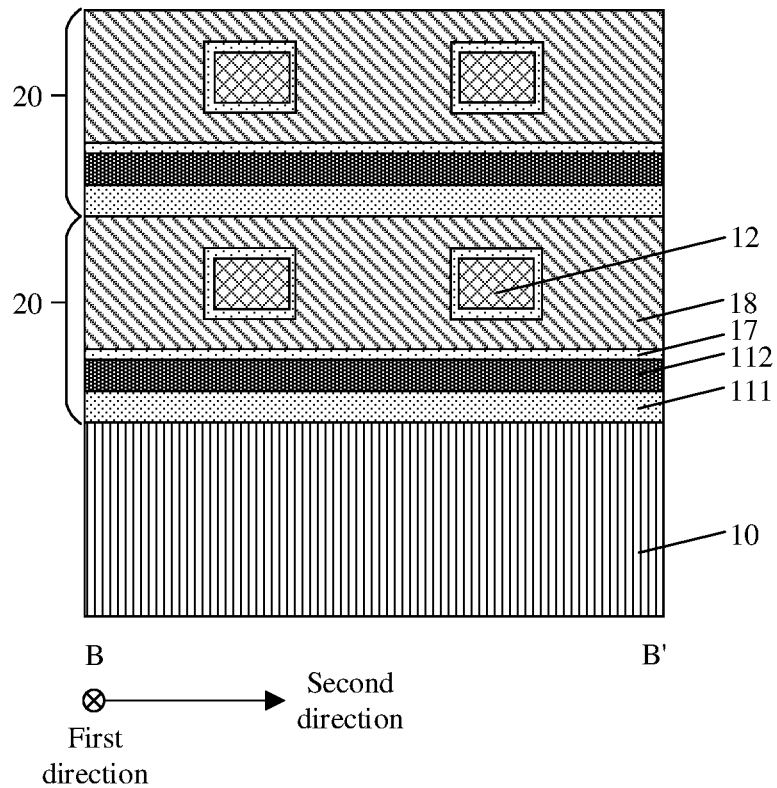

FIG. 1A to FIG. 1C are schematic diagrams of a semiconductor device according to an embodiment of the disclosure. FIG. 1A is a schematic top view of a semiconductor device according to an embodiment of the disclosure. FIG. 1B is a schematic cross-sectional diagram taken along a line AA' in FIG. 1A. FIG. 1C is a schematic cross-sectional diagram taken along a line BB' in FIG. 1A. Hereinafter, a method for manufacturing a semiconductor device according to an embodiment of the disclosure will be further described in detail with reference to FIG. 1A to FIG. 1C.

As shown in the figures, the semiconductor device includes a substrate 10, and a plurality of storage structures 20 stacked on the substrate 10. Each storage structure 20 includes: a first dielectric layer 11; a channel layer 12 arranged in the first dielectric layer 11 and extending in a first direction, the first dielectric layer 11 being provided with a plurality of first grooves S1 isolating the channel layer 12; and a capacitor structure 13 covering a sidewall and a bottom surface of each first groove S1.

The substrate may be a semiconductor substrate, and may include at least one elemental semiconductor material (e.g. a silicon (Si) substrate, a germanium (Ge) substrate), at least one III-V compound semiconductor material, at least one II-VI compound semiconductor material, at least one organic semiconductor material, or other semiconductor materials known in the art. In a specific embodiment, the substrate is a silicon substrate, which may be doped or undoped.

As shown in FIG. 1B, in an embodiment, the first dielectric layer 11 includes a first dielectric sub-layer 111, an etching barrier layer 112 and a second dielectric sub-layer 113 arranged from bottom to top. The first groove S1 penetrates through the second dielectric sub-layer 113 and exposes the etching barrier layer 112. The function of the etching barrier layer 112 is to prevent the first groove S1 from penetrating through the first dielectric layer 11 during the formation of the first groove S1, thereby preventing the capacitor structure 13 in the first groove S1 from being electrically connected to the substrate 10. The material of the etching barrier layer 112 may be nitride, such as silicon nitride. The materials of the first dielectric sub-layer 111 and the second dielectric sub-layer 113 may be oxide. In some embodiments, the material of the first dielectric sub-layer 111 is the same as the material of the second dielectric sub-layer 113, for example, silicon oxide.

In an embodiment, there are a plurality of channel layers 12. The plurality of channel layers 12 are arranged in a second direction, and each of the plurality of channel layers 12 is isolated by the plurality of first grooves S1. The plurality of first grooves S1 are arranged in the second direction. In some embodiments, the channel layer 12 is arranged in the second dielectric sub-layer 113, and an upper surface of the channel layer 12 is flush with an upper surface of the second dielectric sub-layer 113. The material of the channel layer 12 includes one or more of indium oxide, tin oxide, indium zinc oxide, tin zinc oxide, aluminum zinc oxide, indium gallium oxide, indium gallium zinc oxide, indium aluminum zinc oxide, indium tin zinc oxide, tin gallium zinc oxide, aluminum gallium zinc oxide, or tin aluminum zinc oxide. The material of the channel layer 12 may also include silicon, germanium, silicon germanium, etc. The channel layer 12 may be doped or undoped. When indium gallium zinc oxide (IGZO) is used as the material of the channel layer 12, it is possible to increase electron mobility, thereby increasing the writing speed of the semiconductor device.

In an embodiment, the first direction and the second direction are parallel to the surface of the substrate 10. In some embodiments, the first direction is perpendicular to the second direction. Without being limited thereto, the first direction may also be oblique to the second direction.

In an embodiment, the plurality of first grooves S11 are arranged in an array in the first direction and in the second direction, respectively. That is to say, in the first direction, a single channel layer 12 is isolated by the plurality of first grooves S11, for example, two first grooves S1 adjacent to each other in the first direction, such as the first groove S11 and the first groove S12 shown in FIG. 1B.

In an embodiment, in the first direction, the two first grooves S11 and S12 adjacent to each other cut the channel layer 12 into an active area AA. The active area AA includes first source/drain doped areas d1 arranged at both ends of the active area AA, and a second source/drain doped area d2 arranged in a middle area of the active area AA. The first source/drain doped area d1 and the second source/drain doped area d2 may be formed in the channel layer 12 through ion implantation. In a specific embodiment, the conductivity type of the first source/drain doped area d1 is the same as the conductivity type of the second source/drain doped area d2, such as an n-type. In a more specific embodiment, an area between the first source/drain doped area d1 and the second source/drain doped area d2 has p-type doping.

As shown in FIG. 1B, in an embodiment, the capacitor structure 13 includes: a first electrode 131 covering the sidewall and the bottom surface of each of the plurality of first grooves S1; a second dielectric layer 132 covering the first electrode 131; and a second electrode 133 covering the second dielectric layer 132. The first electrode 131 is connected to the channel layer 12, and an upper surface of the first electrode 131 is flush with an upper surface of the channel layer 12. In a specific embodiment, the first electrode 131 is connected to the first source/drain doped area (not marked). The material of the second dielectric layer 132 may be a high dielectric constant material, such as tantalum oxide, hafnium oxide, zirconium oxide, niobium oxide, titanium oxide, barium oxide, strontium oxide, yttrium oxide, lanthanum oxide, praseodymium oxide, or barium strontium titanate. The materials of the first electrode 131 and the second electrode 133 may include one or more of tungsten (W), copper (Cu), titanium (Ti), tantalum (Ta), titanium nitride (TiN), tantalum nitride (TaN), metal silicide, or a metal alloy. In some embodiments, the material of the first electrode 131 is the same as the material of the second electrode 133, for example, titanium nitride (TiN). In some other embodiments, the material of the first electrode 131 may be different from the material of the second electrode 133.

In some embodiments, the first groove S1 has a smaller depth-to-width ratio. Thus, the process of forming the capacitor structure 13 on the sidewall and the bottom surface of the first groove S1 is simpler, compared with forming a capacitor pillar with a larger depth-to-width ratio in the related art. That is to say, the process of forming the storage structure 20 in the embodiments of the disclosure is simpler, so that it is beneficial to stack a larger number of storage structures 20 on the substrate 10, thereby increasing the storage capacity of the semiconductor device. In addition, the depth of the first groove S1 is relatively small, i.e. the height of the capacitor structure 13 is relatively small, so that more capacitor structures 13 can be accommodated per unit volume, thereby improving the integration and the storage density of the semiconductor device.

In an embodiment, there are a plurality of capacitor structures 13. The plurality of capacitor structures 13 are arranged in an array in the first direction and in the second direction, respectively. In some embodiments, the second dielectric layers 132 of the plurality of capacitor structures 13 arranged in the second direction are connected to each other, the second electrodes 133 of the plurality of capacitor structures 13 arranged in the second direction are also connected to each other, and the second dielectric layer 132 cover a portion of the first dielectric layer 11 while covering the first electrode 131. In other words, the plurality of capacitor structures 13 arranged in the second direction have the common second dielectric layer 132 and the common second electrode 133, and the second dielectric layer 132 and the second electrode 133 extend in the second direction, so that the manufacturing process of the semiconductor device is simplified. In some embodiments, the second dielectric layer 132 also covers a portion of the channel layer 12.

In an embodiment, in the first direction, two capacitor structures 13 arranged on the sidewalls and the bottom surfaces of the two adjacent first grooves S1 have the common second dielectric layer 132 and the common second electrode 133, so that the manufacturing process of the semiconductor device is further simplified.

In an embodiment, the storage structure 20 further includes an opening 14 arranged in and above the first groove S1 and a filling layer 15 arranged in the opening 14. The opening 14 is formed because the capacitor structure 13 does not completely fill the first groove S1. An upper surface of the filling layer 15 is flush with an upper surface of the second electrode 133. The material of the filling layer 15 includes nitride, such as silicon nitride.

In an embodiment, the storage structure 20 further includes a third dielectric layer 16. The third dielectric layer 16 covers the channel layer 12 and the first dielectric layer 11. A second groove S2 extending in the second direction is provided in the third dielectric layer 16 and the first dielectric layer 11. The second groove S2 exposes the channel layer 12. In a specific embodiment, the storage structure 20 further includes a word line layer 18 extending in the second direction. The word line layer 18 is arranged in the second groove S2. The material of the third dielectric layer 16 includes oxide, such as silicon oxide. The material of the word line layer 18 includes include one or more of tungsten (W), copper (Cu), titanium (Ti), tantalum (Ta), titanium nitride (TiN), tantalum nitride (TaN), metal silicide, or a metal alloy.

Here, an upper surface of the third dielectric layer 16 is flush with each of an upper surface of the second electrode 133 and an upper surface of the filling layer 15. The second groove S2 penetrates through the third dielectric layer 16 and the second dielectric sub-layer 113 from top to bottom, and exposes the etching barrier layer 112 and the channel layer 12. The word line layer 18 arranged in the second groove S2 extends in the second direction and is arranged around the channel layer 12. The manufacturing process of the word line layer 18 is relatively simple.

In an embodiment, there are a plurality of second grooves S2 arranged in the first direction. There are a plurality of word line layers 18 arranged in the first direction. In a specific embodiment, in the first direction, two word line layers 18 are provided between two adjacent first grooves S11 and S12. In a more specific embodiment, each word line layer 18 is arranged between the first source/drain doped area d1 and the second source/drain doped area d2 to separates the first source/drain doped area d1 from the second source/drain doped area d2.

In an embodiment, the storage structure 20 further includes a fourth dielectric layer 17. The fourth dielectric layer 17 covers a surface of the channel layer 12 exposed by the second groove S2 and covers a sidewall and a bottom surface of the second groove S2, the third dielectric layer 16, and the capacitor structure 13. The word line layer 18 is separated from the channel layer 12 by the fourth dielectric layer 17, and an upper surface of the word line layer 18 is flush with an upper surface of the fourth dielectric layer 17. In some embodiments, the fourth dielectric layer 17 also covers the filling layer 15. The fourth dielectric layer 17 may be oxide, such as silicon oxide.

In an embodiment, the semiconductor device further includes a bit line layer 19. The bit line layer 19 extends from a topmost storage structure 20 down to a bottommost storage structure 20, and is connected to the channel layers 12 in the plurality of storage structures 20. The material of the bit line layer 19 includes one or more of tungsten (W), copper (Cu), titanium (Ti), tantalum (Ta), titanium nitride (TiN), tantalum nitride (TaN), metal silicide, or a metal alloy.

In an embodiment, the method for forming the bit line layer 19 may be as follows. Firstly, the plurality of storage structures 20 are etched from top to bottom to form a second trench T2. The second trench T2 extends from the topmost storage structure 20 down to the bottommost storage structure 20 and penetrates through the channel layers 12 in the plurality of storage structures 20. Then, the bit line layer 19 is formed in the second trench T2. In the embodiments of the disclosure, the second trench T2 connecting the plurality of channel layers 12 is formed by one-step punching, and the bit line layer 19 is formed in the second trench T2, so that the manufacturing process of the bit line layer 19 is simplified. In some embodiments, in the first direction, one bit line layer 19 is provided between the two word line layers 18 between two adjacent first grooves S11 and S12. Thus, the two capacitor structures 13 and the two adjacent word line layers 18 share one bit line layer 19, so that the manufacturing process of the semiconductor device is further simplified, and the space is saved, thereby improving the storage density of the semiconductor device. In a specific embodiment, the bit line layer 19 is connected to the second source/drain doped area d2.

In an embodiment, there are a plurality of bit line layers 19 arranged in the second direction, as shown in FIG. 1A. In some embodiments, the bit line layers 19 may also be arranged in an array in the first direction and in the second direction, respectively.

It can be seen that the semiconductor device provided by the embodiments of the disclosure includes a plurality of storage structures 20 stacked on the substrate 10, so that the integration and the storage density of the semiconductor device are improved.

Figure 2:
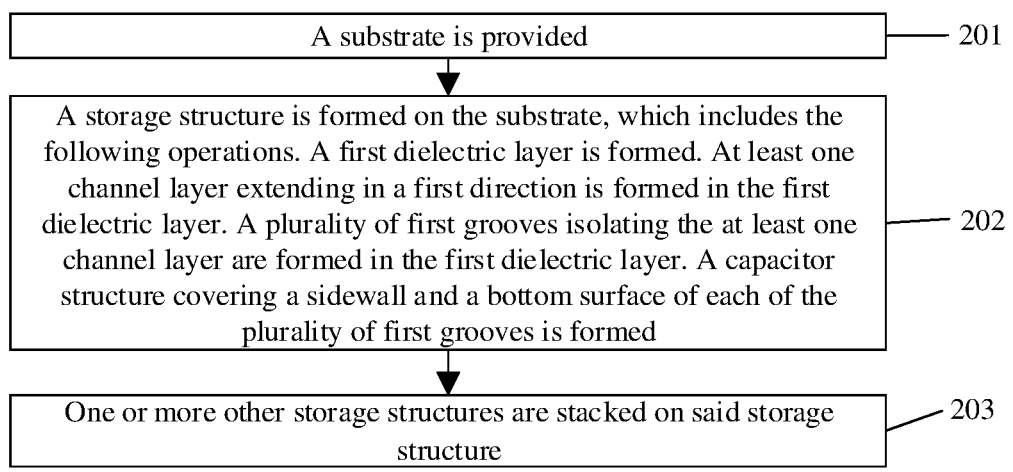
FIG. 2 is a block flowchart of a method for manufacturing a semiconductor device according to an embodiment of the disclosure.

An embodiment of the disclosure further provides a method for manufacturing a semiconductor device. As shown in FIG. 2, the method includes the following operations.

In S201, a substrate is provided.

In S202, a storage structure is formed on the substrate, which includes the following operations. A first dielectric layer is formed. At least one channel layer extending in a first direction is formed in the first dielectric layer. A plurality of first grooves isolating the at least one channel layer are formed in the first dielectric layer. A capacitor structure covering a sidewall and a bottom surface of each of the plurality of first grooves is formed.

In S203, one or more other storage structures are stacked on said storage structure.

FIG. 3A to FIG. 16C are process flowcharts of a semiconductor device according to an embodiment of the disclosure. FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, and FIG. 16A are schematic top views of various process operations in a method for manufacturing a semiconductor device according to an embodiment of the disclosure. FIG. 3B, FIG. 4B, FIG. 5B, FIG. 6B, FIG. 7B, FIG. 8B, FIG. 9B, FIG. 10B, FIG. 11B, FIG. 12B, FIG. 13B, FIG. 14B, FIG. 15B, and FIG. 16B are schematic cross-sectional diagrams taken along lines AA' in FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, and FIG. 16A respectively. FIG. 3C, FIG. 4C, FIG. 5C, FIG. 6C, FIG. 7C, FIG. 8C, FIG. 9C, FIG. 10C, FIG. 11C, FIG. 12C, FIG. 13C, FIG. 14C, FIG. 15C, and FIG. 16C are schematic cross-sectional diagrams taken along lines BB' in FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, and FIG. 16A respectively. Hereinafter, a method for manufacturing a semiconductor device according to an embodiment of the disclosure will be further described in detail with reference to FIG. 3A to FIG. 16C.

Figure 3A:
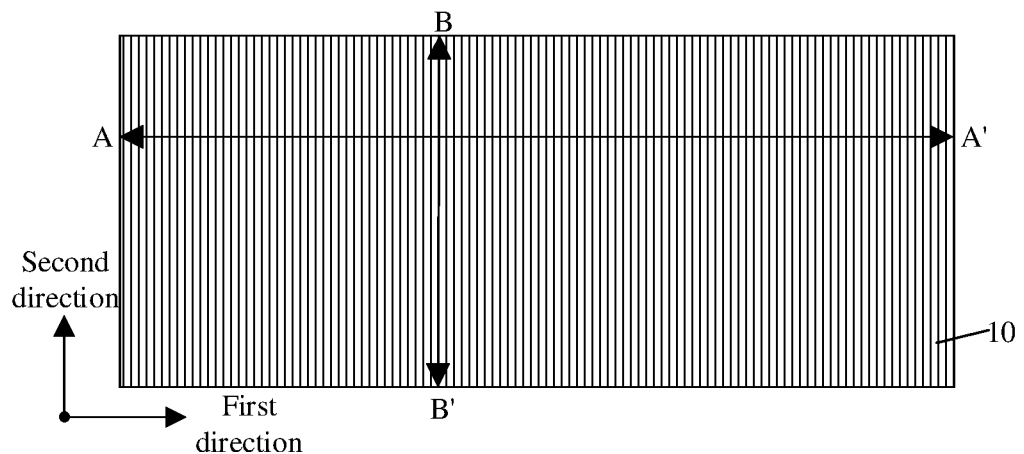
FIG. 3A to FIG. 3C, FIG. 4A to FIG. 4C, FIG. 5A to FIG. 5C, FIG. 6A to FIG. 6C, FIG. 7A to FIG. 7C, FIG. 8A to FIG. 8C, FIG. 9A to FIG. 9C, FIG. 10A to FIG. 10C, FIG. 11A to FIG. 11C, FIG. 12A to FIG. 12C, FIG. 13A to FIG. 13C, FIG. 14A to FIG. 14C, FIG. 15A to FIG. 15C, and FIG. 16A to FIG. 16C are process flowcharts of a semiconductor device according to an embodiment of the disclosure.
Figure 3B:
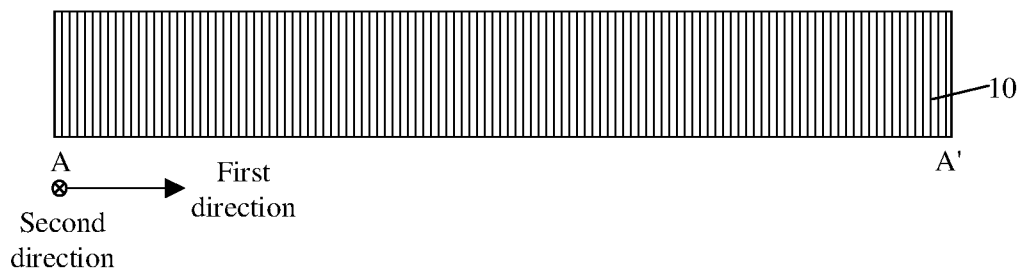
Figure 3C:
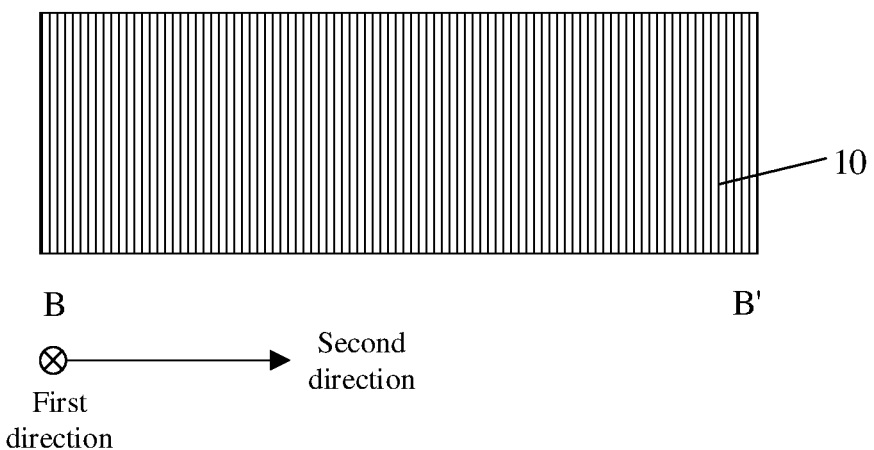

Firstly, S201 is performed, as shown in FIG. 3A to FIG. 3C, in which a substrate 10 is provided.

The substrate may be a semiconductor substrate, and may include at least one elemental semiconductor material (e.g. a silicon (Si) substrate, a germanium (Ge) substrate), at least one III-V compound semiconductor material, at least one II-VI compound semiconductor material, at least one organic semiconductor material, or other semiconductor materials known in the art. In a specific embodiment, the substrate is a silicon substrate, which may be doped or undoped.

Next, S202 is performed, as shown in FIG. 4A to FIG. 16C, in which a storage structure 20 is formed on the substrate 10, which includes the following operations. A first dielectric layer 11 is formed. A channel layer 12 extending in a first direction is formed in the first dielectric layer 11. A plurality of first grooves S1 isolating the channel layer 12 are formed in the first dielectric layer 11. A capacitor structure 13 covering a sidewall and a bottom surface of each first groove S1 is formed.

Figure 4A:
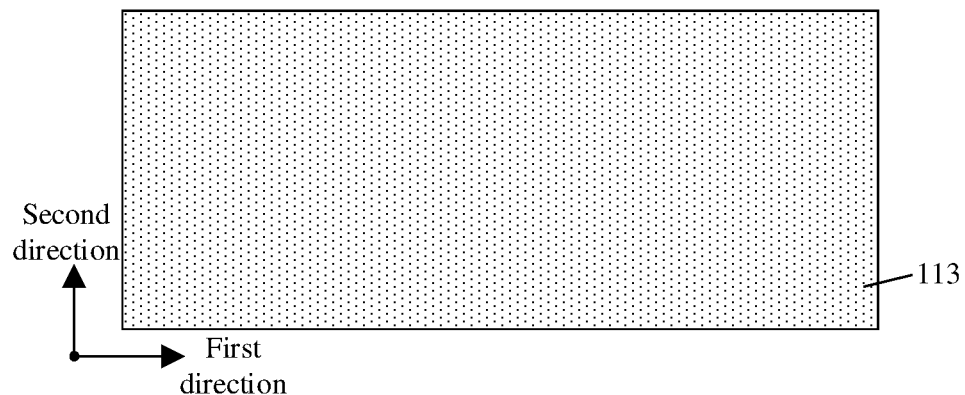
Figure 4B:
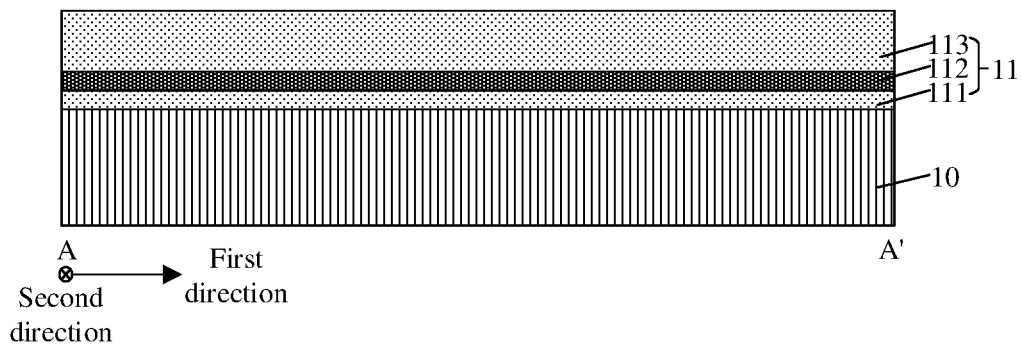
Figure 4C:
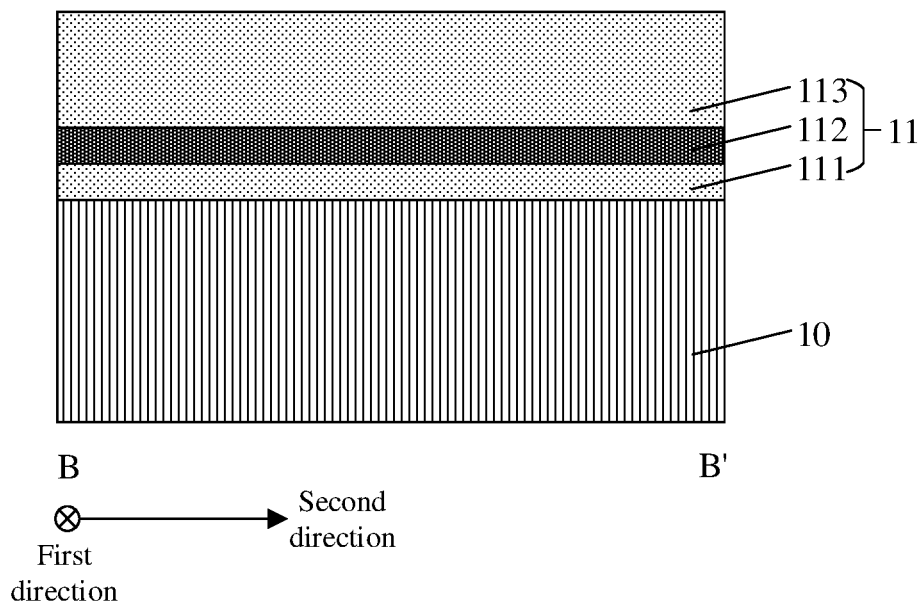

Specifically, firstly, as shown in FIG. 4A to FIG. 4C, the first dielectric layer 11 includes a first dielectric sub-layer 111, an etching barrier layer 112 and a second dielectric sub-layer 113. The operation that the first dielectric layer 11 is formed specifically includes the following operations. The first dielectric sub-layer 111 is formed. The etching barrier layer 112 is formed on the first dielectric sub-layer 111. The second dielectric sub-layer 113 is formed on the etching barrier layer 112. The material of the etching barrier layer 112 may be nitride, such as silicon nitride. The materials of the first dielectric sub-layer 111 and the second dielectric sub-layer 113 may be oxide. In some embodiments, the material of the first dielectric sub-layer 111 is the same as the material of the second dielectric sub-layer 113, for example, silicon oxide.

Next, as shown in FIG. 5A to FIG. 6C, there are a plurality of channel layers 12 arranged in the second direction. The operation that the plurality of channel layers 12 are formed in the first dielectric layer 11 specifically includes the following operations.

Figure 5A:
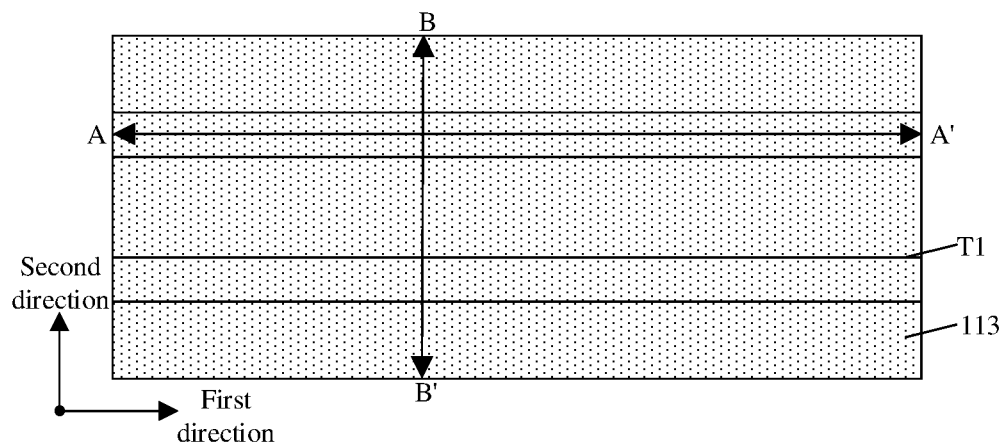
Figure 5B:
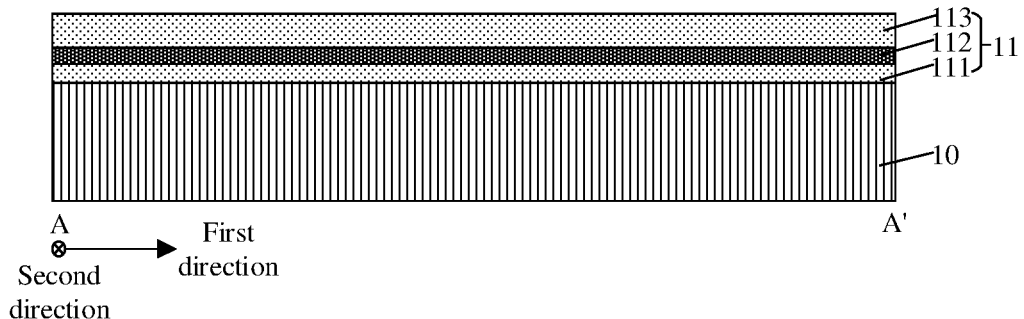
Figure 5C:
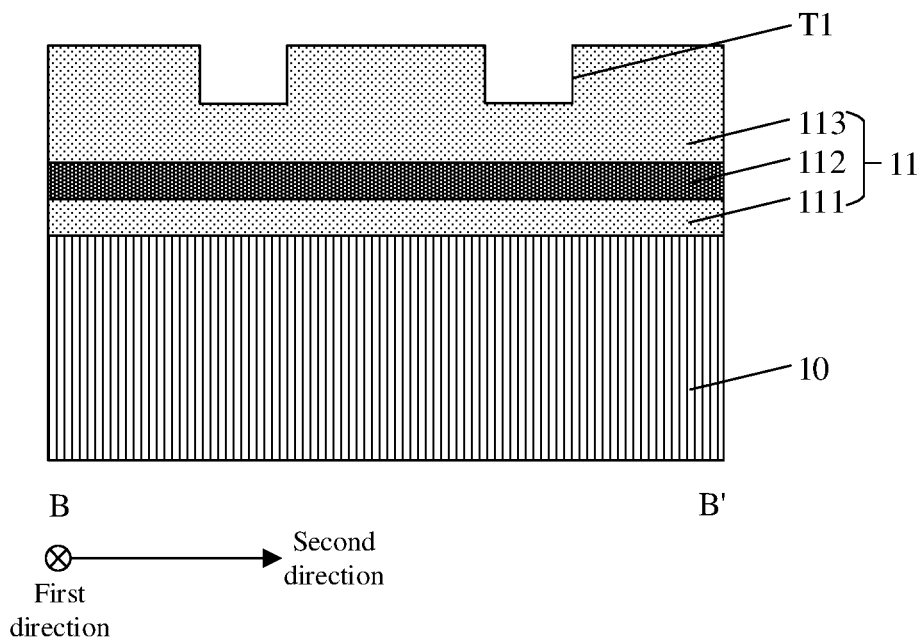

The second dielectric sub-layer 113 is etched to form a plurality of first trenches T1 in the second dielectric sub-layer 113. Each of the plurality of first trenches extends in the first direction, and the plurality of first trenches T1 are arranged in the second direction (as shown in FIG. 5A to FIG. 5C).

Figure 6A:
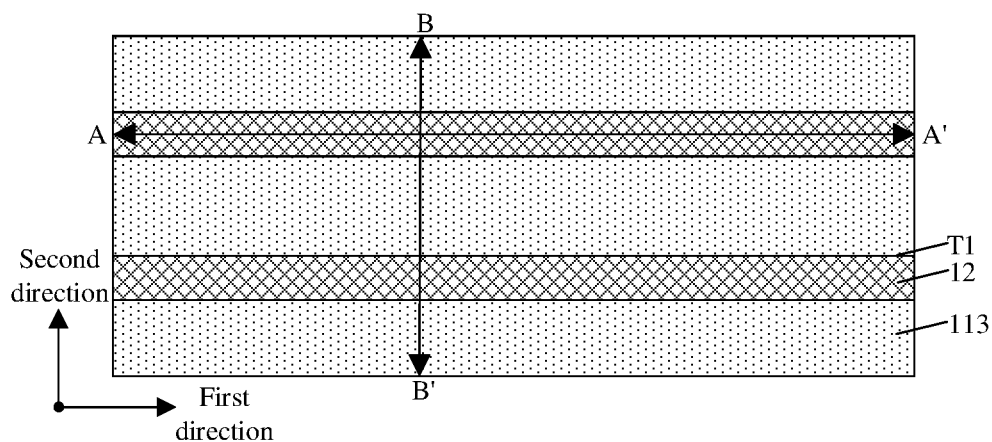
Figure 6B:
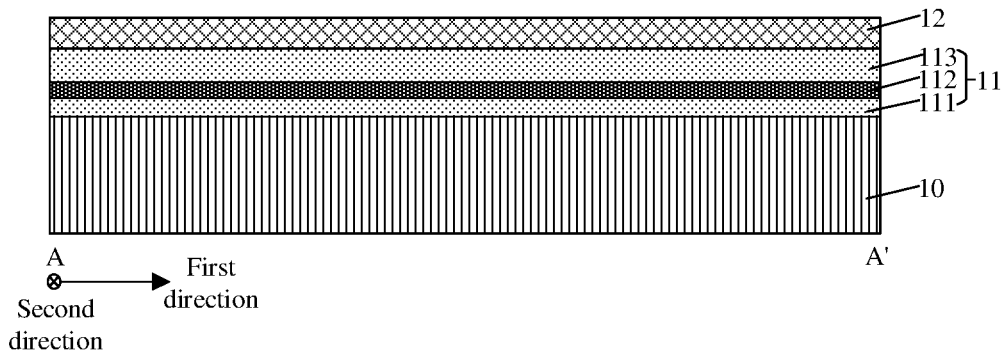
Figure 6C:
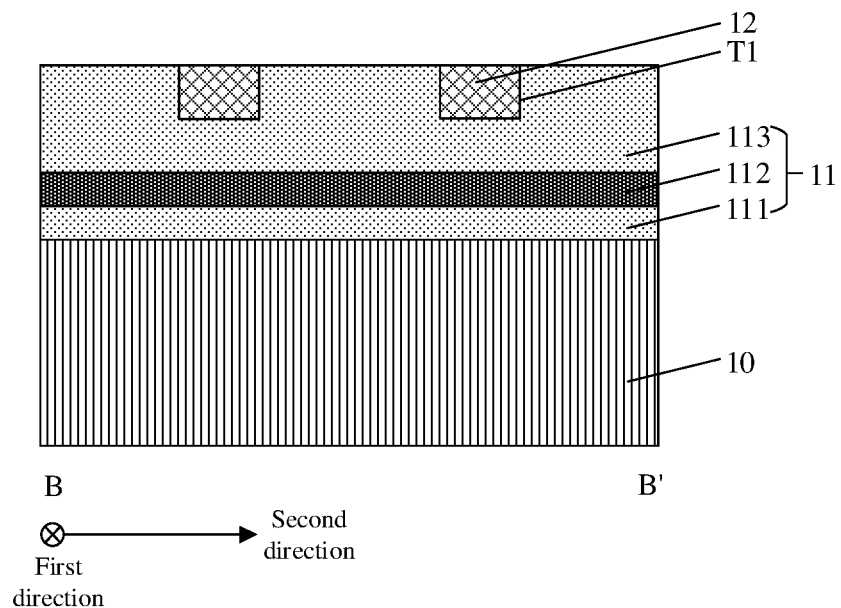

Each of the plurality of channel layers 12 is formed in a respective one of the plurality of first trenches T1 (as shown in FIG. 6A to FIG. 6C).

In an embodiment, the first direction and the second direction are parallel to the surface of the substrate 10. In some embodiments, the first direction is perpendicular to the second direction. Without being limited thereto, the first direction may also be oblique to the second direction.

As shown in FIG. 6C, the channel layer 12 is arranged in the second dielectric sub-layer 113, and an upper surface of the channel layer 12 is flush with an upper surface of the second dielectric sub-layer 113. The material of the channel layer 12 includes one or more of silicon, germanium, silicon germanium, indium oxide, tin oxide, indium zinc oxide, tin zinc oxide, aluminum zinc oxide, indium gallium oxide, indium gallium zinc oxide, indium aluminum zinc oxide, indium tin zinc oxide, tin gallium zinc oxide, aluminum gallium zinc oxide, or tin aluminum zinc oxide. The channel layer 12 may be doped or undoped. When indium gallium zinc oxide (IGZO) is used as the material of the channel layer 12, it is possible to increase electron mobility, thereby increasing the writing speed of the semiconductor device.

Figure 7A:
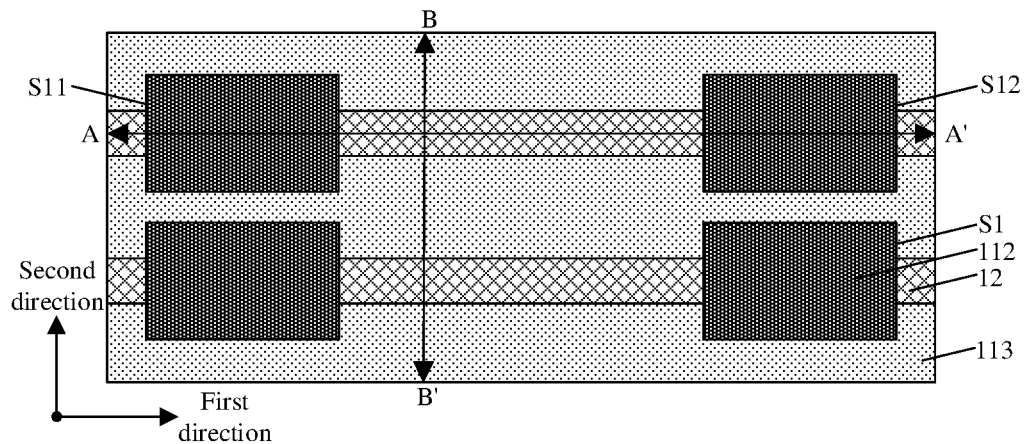
Figure 7B:
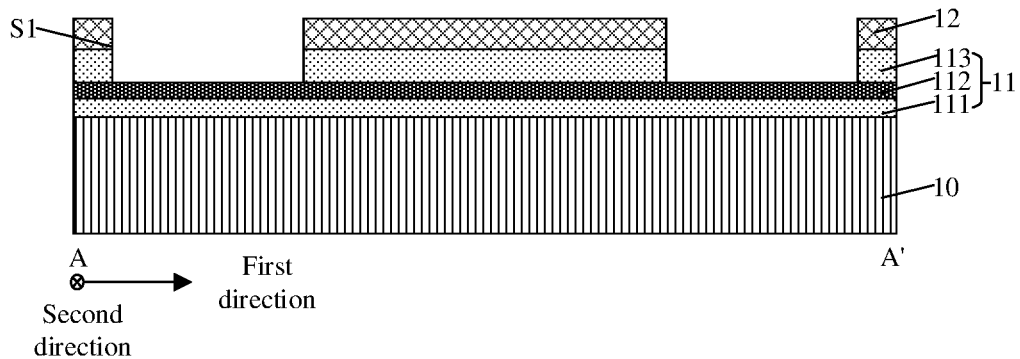
Figure 7C:
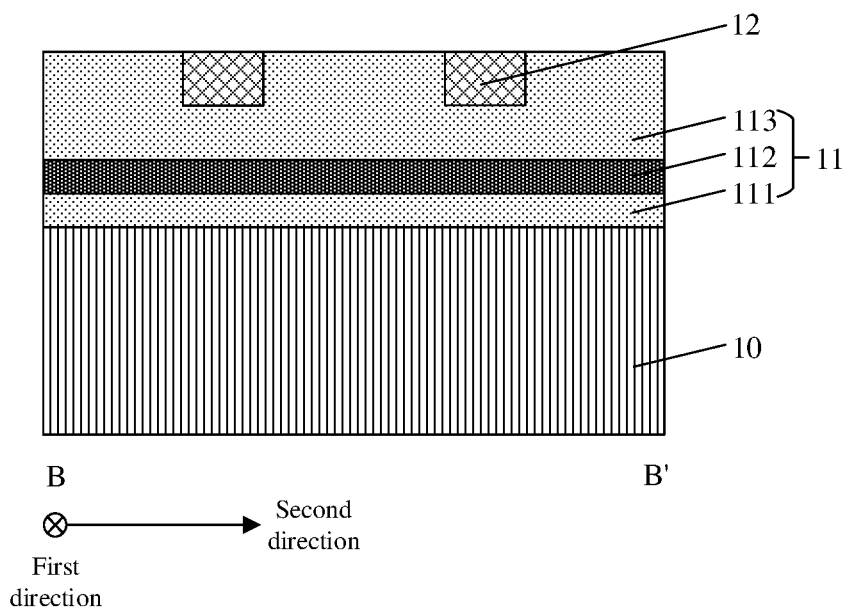

Next, as shown in FIG. 7A to FIG. 7C, the plurality of channel layers 12 are isolated by the plurality of first grooves S1, and the plurality of first grooves S1 are arranged in the second direction. The operation that the plurality of first grooves S1 isolating the channel layer 12 are formed in the first dielectric layer 11 includes the following operations. The plurality of channel layers 12 and the second dielectric sub-layer 113 are etched from top to bottom to expose the etching barrier layer 112, so as to form the plurality of first grooves S1. In the above etching process, the function of the etching barrier layer 112 is to prevent the first groove S1 from penetrating through the first dielectric layer 11 during the formation of the first groove S1, thereby preventing the capacitor structure 13 in the first groove S1 from being electrically connected to the substrate 10.

In an embodiment, the plurality of first grooves S1 are arranged in an array in the first direction and in the second direction, respectively. That is to say, in the first direction, a single channel layer 12 is isolated by the plurality of first grooves S1, for example, two first grooves S1 adjacent to each other in the first direction, i.e., the first groove S11 and the first groove S12.

Next, as shown in FIG. 8A to FIG. 11C, the capacitor structure 13 includes a first electrode 131, a second dielectric layer 132 and a second electrode 133. The operation that the capacitor structure 13 is formed includes the following operations.

Figure 8A:
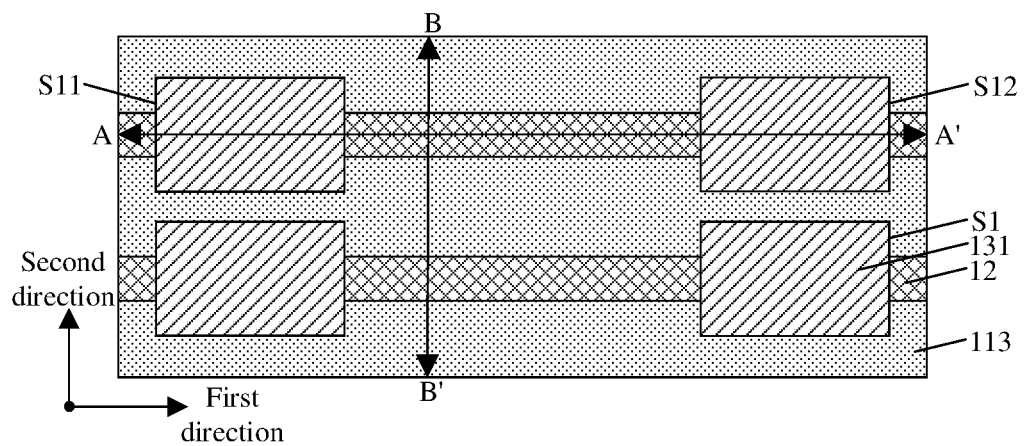
Figure 8B:
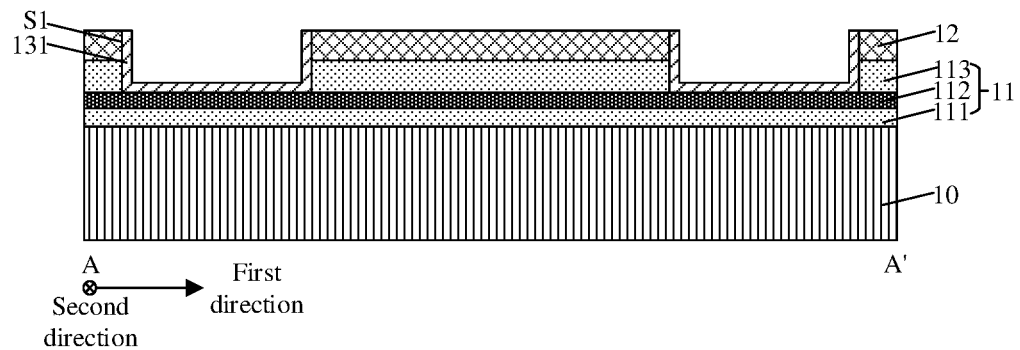
Figure 8C:
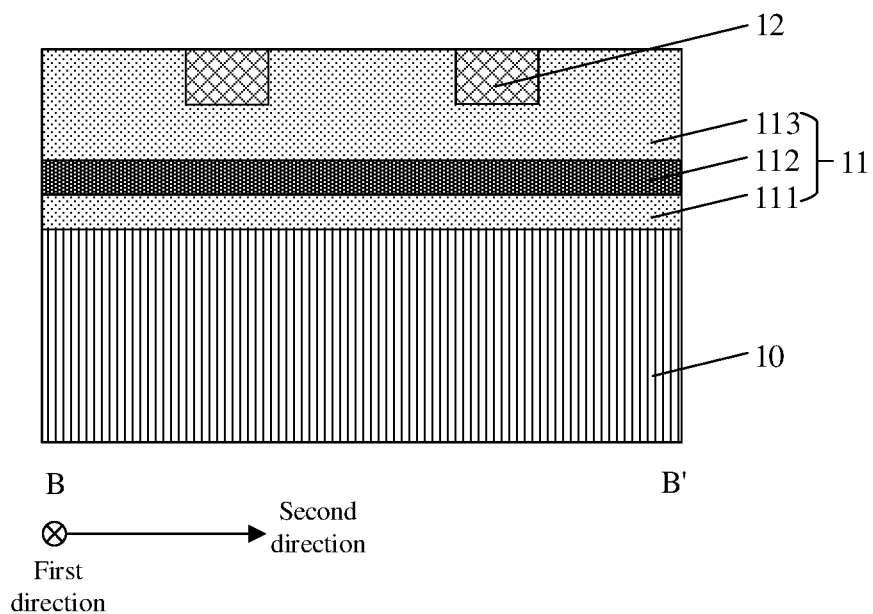

The first electrode 131 is formed in the first groove S1. The first electrode 131 covers the sidewall and the bottom surface of the first groove S1 (as shown in FIG. 8A to FIG. 8C).

Figure 9A:
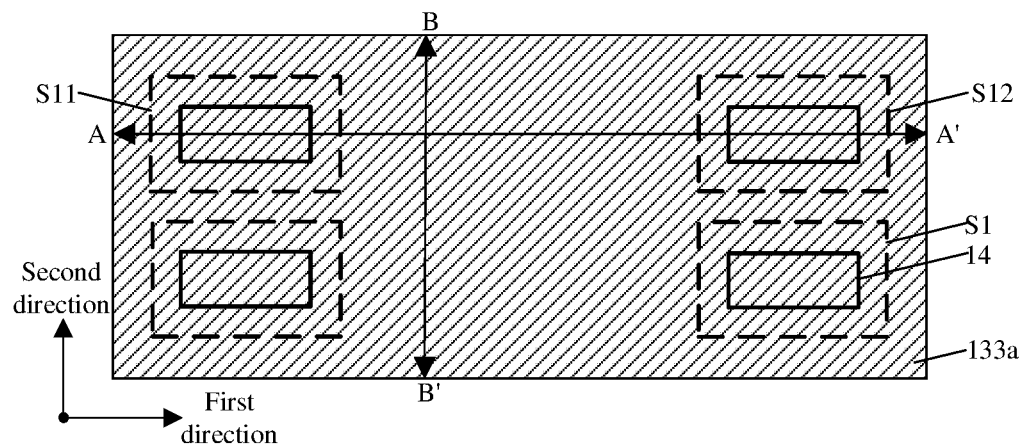
Figure 9B:
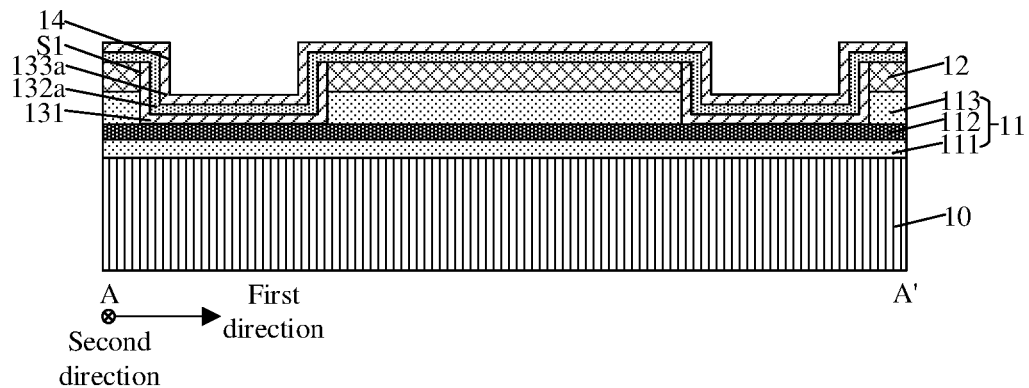
Figure 9C:
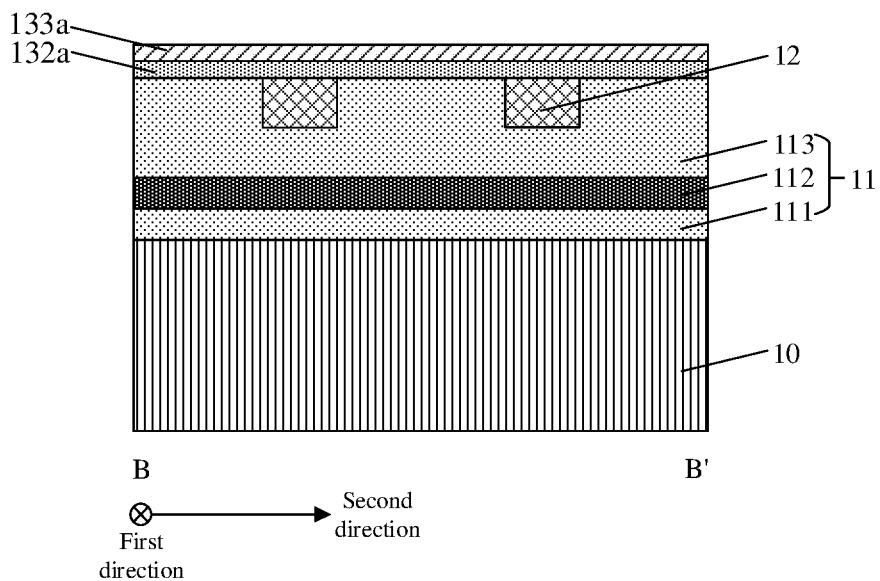

A second dielectric material layer 132a is formed on the first dielectric layer 11, the plurality of channel layers 12 and the first electrode 131, and a second electrode material layer 133a is formed on the second dielectric material layer 132a (as shown in FIG. 9A to FIG. 9C).

Figure 11A:
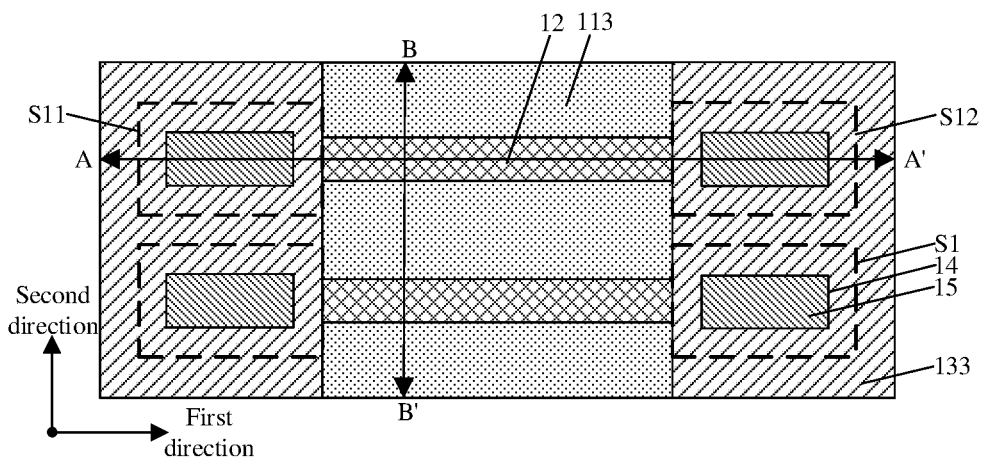

A portion of the second electrode material layer 133a is removed to form the second electrode 133, and a portion of the second dielectric material layer 132a is removed to form the second dielectric layer 132. The second electrode 133 and the second dielectric layer 132 cover the first electrode 131 (as shown in FIG. 11A to FIG. 11C).

Figure 11B:
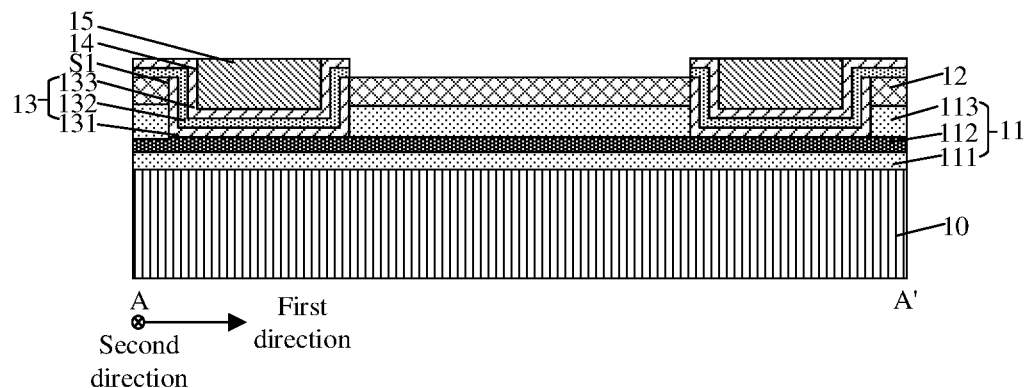
Figure 11C:
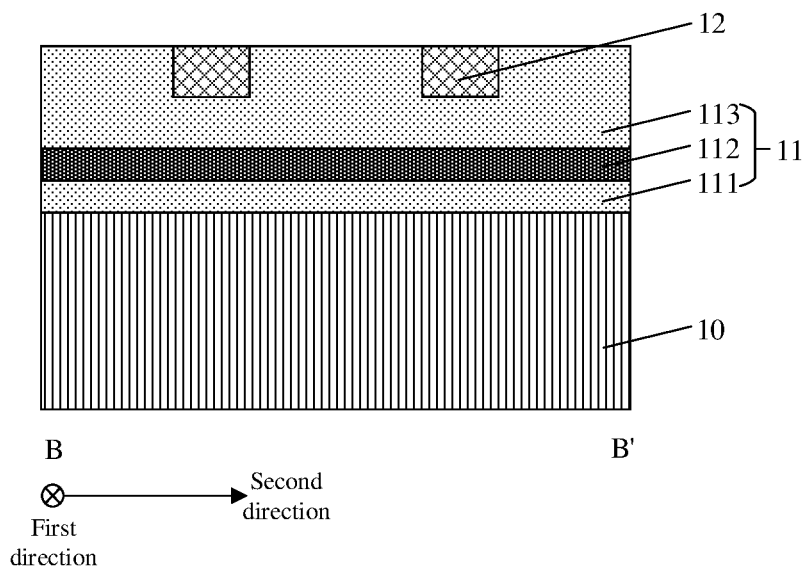

As shown in FIG. 11B, the first electrode 131 is connected to the channel layer 12, and an upper surface of the first electrode 131 is flush with an upper surface of the channel layer 12. In actual operation, the material of the second dielectric layer 132 may be a high dielectric constant material, such as tantalum oxide, hafnium oxide, zirconium oxide, niobium oxide, titanium oxide, barium oxide, strontium oxide, yttrium oxide, lanthanum oxide, praseodymium oxide, or barium strontium titanate. The materials of the first electrode 131 and the second electrode 133 may include one or more of tungsten (W), copper (Cu), titanium (Ti), tantalum (Ta), titanium nitride (TiN), tantalum nitride (TaN), metal silicide, or a metal alloy. In some embodiments, the material of the first electrode 131 is the same as the material of the second electrode 133, for example, titanium nitride (TiN).

In an embodiment, there are a plurality of capacitor structures 13 arranged in an array in the first direction and in the second direction, respectively. In some embodiments, the second dielectric layers 132 of the plurality of capacitor structures 13 arranged in the second direction are connected to each other, the second electrodes 133 of the plurality of capacitor structures 13 arranged in the second direction are also connected to each other, and the second dielectric layers 132 cover a portion of the first dielectric layers 11 while covering the first electrodes 131, as shown in FIG. 11A. In other words, the plurality of capacitor structures 13 arranged in the second direction have the common second dielectric layer 132 and the common second electrode 133, and the second dielectric layer 132 and the second electrode 133 extend in the second direction, so that the manufacturing process of the semiconductor device is simplified. In some embodiments, the second dielectric layer 132 also covers a portion of the channel layer 12.

Figure 10A:
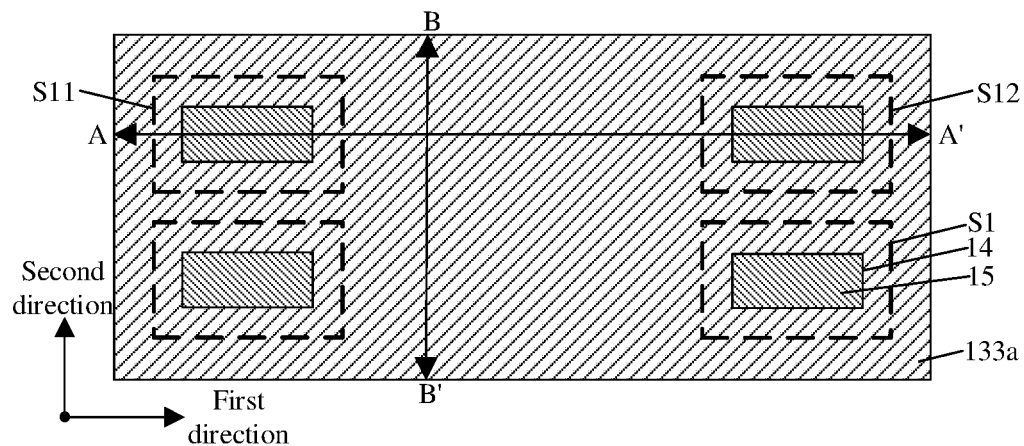
Figure 10B:
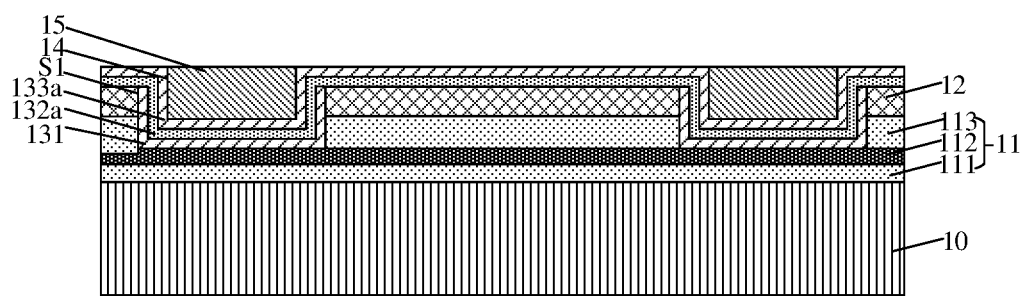
Figure 10C:
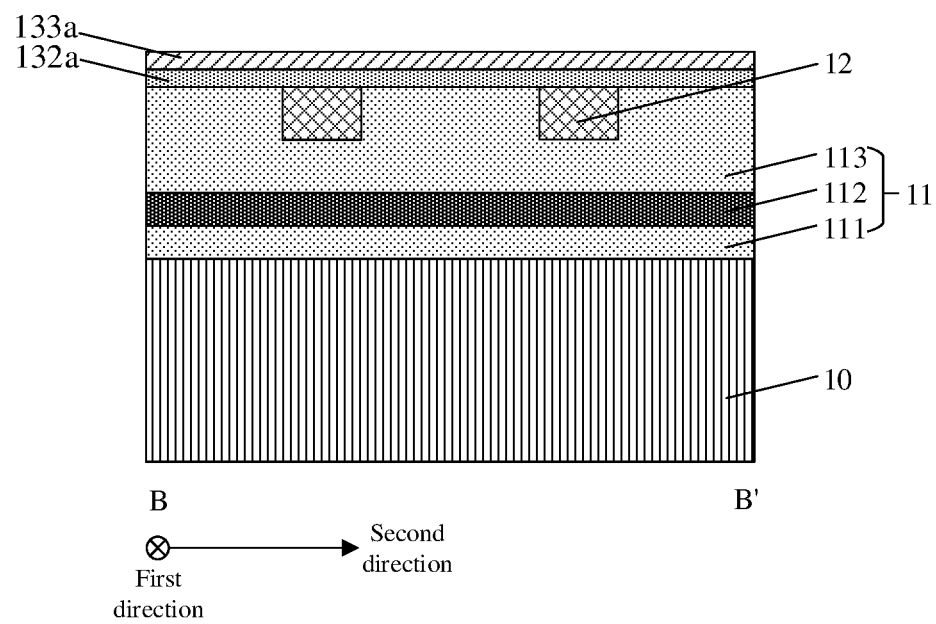

With reference to FIG. 9A to FIG. 9C, in an embodiment, after the second electrode material layer 133a is formed on the second dielectric material layer 132a, the storage structure 20 forms an opening 14 arranged in and above the first groove S1. The opening 14 is formed because the first electrode 131, the second dielectric material layer 132a and the second electrode material layer 133a do not completely fill the first groove S1. In a specific embodiment, the operation that the storage structure 20 is formed further includes the following operation. A filling layer 15 is formed in the opening 14. An upper surface of the filling layer 15 is flush with an upper surface of the second electrode material layer 133a, as shown in FIG. 10A to FIG. 10C. The material of the filling layer 15 includes nitride, such as silicon nitride.

Next, as shown in FIG. 12A to FIG. 13C, the storage structure 20 further includes a third dielectric layer 16, and a second groove S2 extending in the second direction. After the capacitor structure 13 is formed, the method further includes the following operations.

Figure 12A:
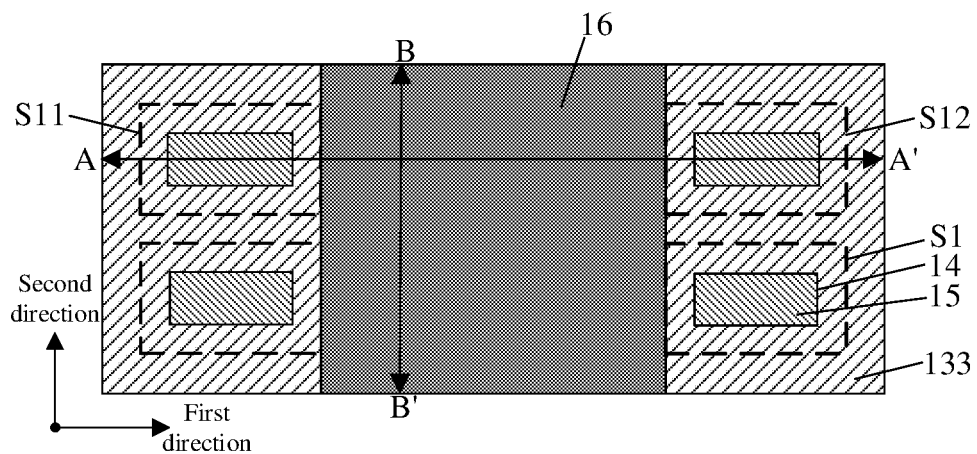
Figure 12B:
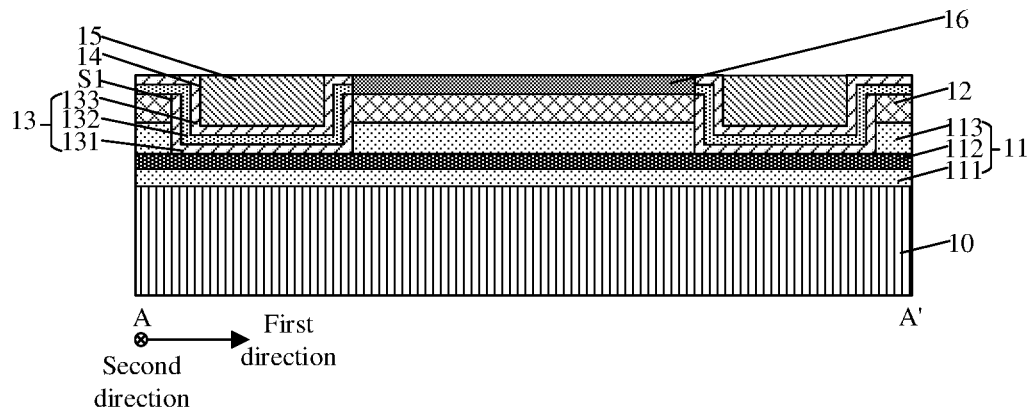
Figure 12C:
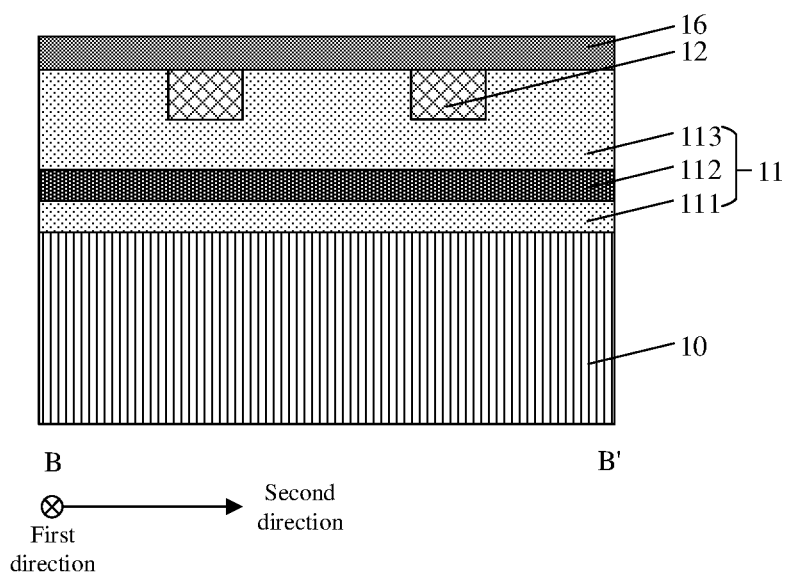

The third dielectric layer 16 is formed on the plurality of channel layers 12 and on the first dielectric layer 11 (as shown in FIG. 12A to FIG. 12C). The material of the third dielectric layer 16 includes oxide, such as silicon oxide.

Figure 13A:
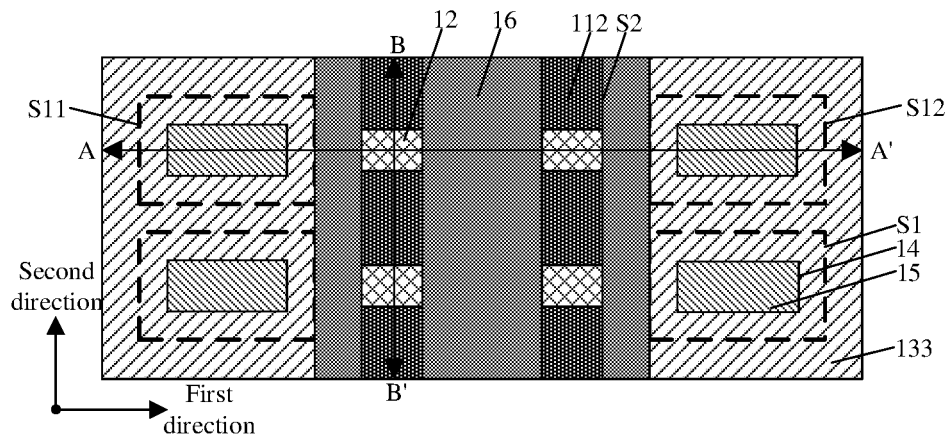
Figure 13B:
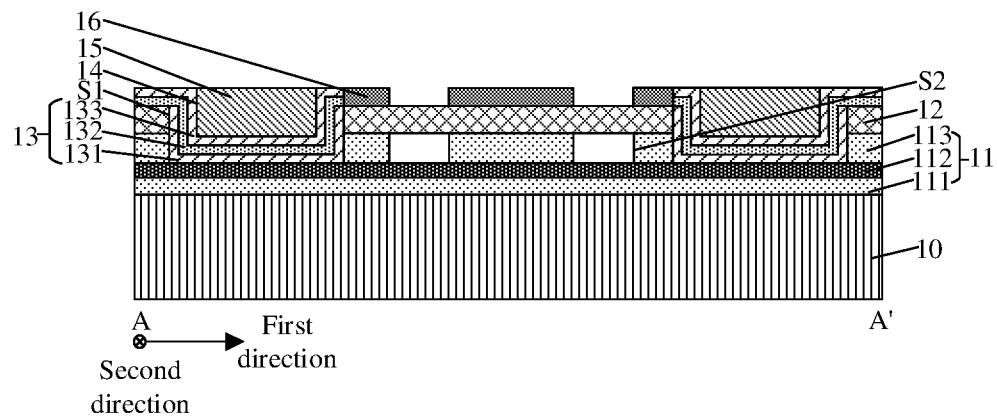
Figure 13C:
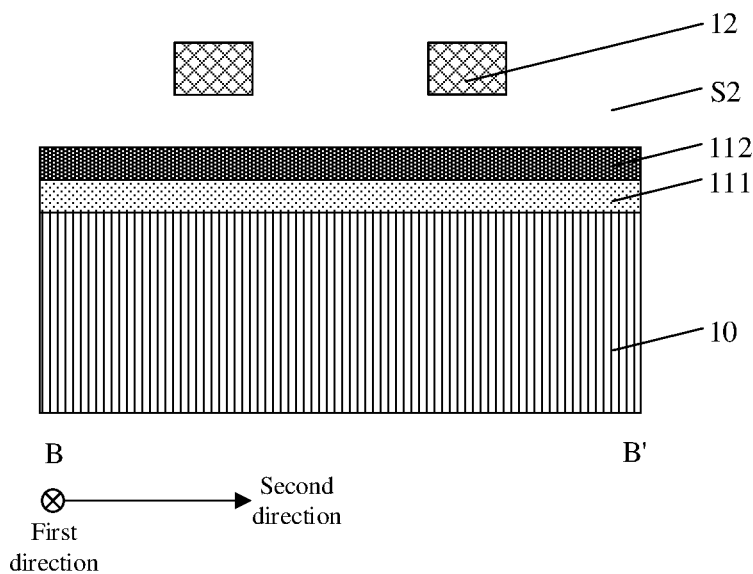

A portion of the first dielectric layer 11 and a portion of the third dielectric layer 16 are removed, so as to form the second groove S2 in the first dielectric layer 11 and the third dielectric layer 16. The second groove S2 exposes the plurality of channel layers 12 (as shown in FIG. 13A to FIG. 13C).

Figure 15A:
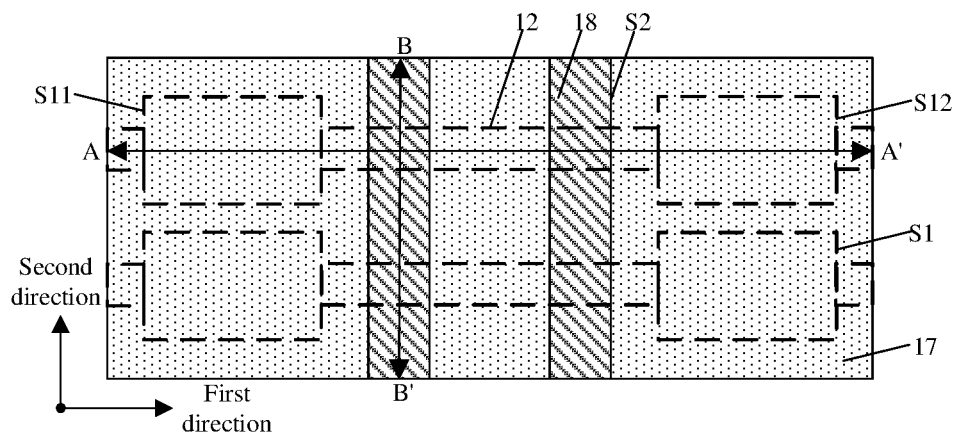
Figure 15B:
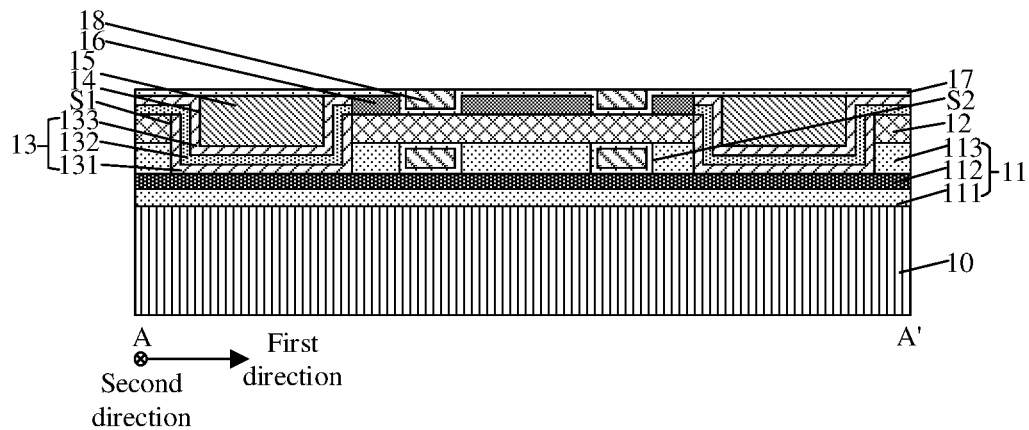
Figure 15C:
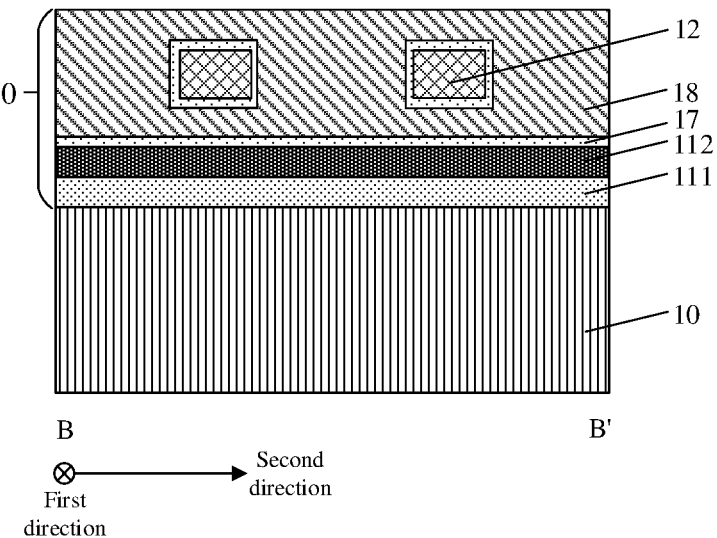

Next, as shown in FIG. 15A to FIG. 15C, the storage structure further includes a word line layer 18 extending in the second direction. After the second groove S2 is formed, the method further includes the following operation. The word line layer 18 is formed in the second groove S2. The material of the word line layer 18 includes one or more of tungsten (W), copper (Cu), titanium (Ti), tantalum (Ta), titanium nitride (TiN), tantalum nitride (TaN), metal silicide, or a metal alloy.

In an embodiment, an upper surface of the third dielectric layer 16 is flush with each of an upper surface of the second electrode 133 and an upper surface of the filling layer 15. The second groove S2 penetrates through the third dielectric layer 16 and the second dielectric sub-layer 113 from top to bottom, and exposes the etching barrier layer 112 and the channel layer 12. The word line layer 18 arranged in the second groove S2 extends in the second direction and is arranged around the channel layer 12. The manufacturing process of the word line layer 18 is relatively simple.

In some embodiments, there are a plurality of second grooves S2 arranged in the first direction. There are a plurality of word line layers 18 arranged in the first direction. In a specific embodiment, in the first direction, two word line layers 18 are provided between two adjacent first grooves S11 and S12.

Figure 14A:
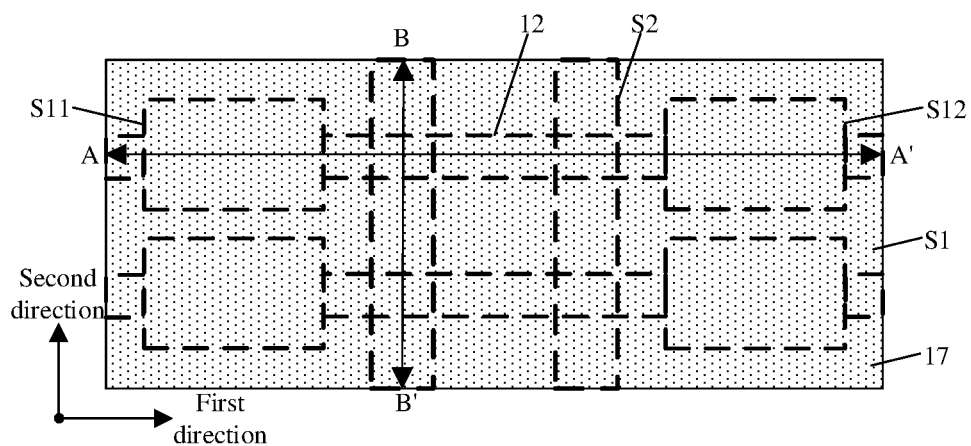
Figure 14B:
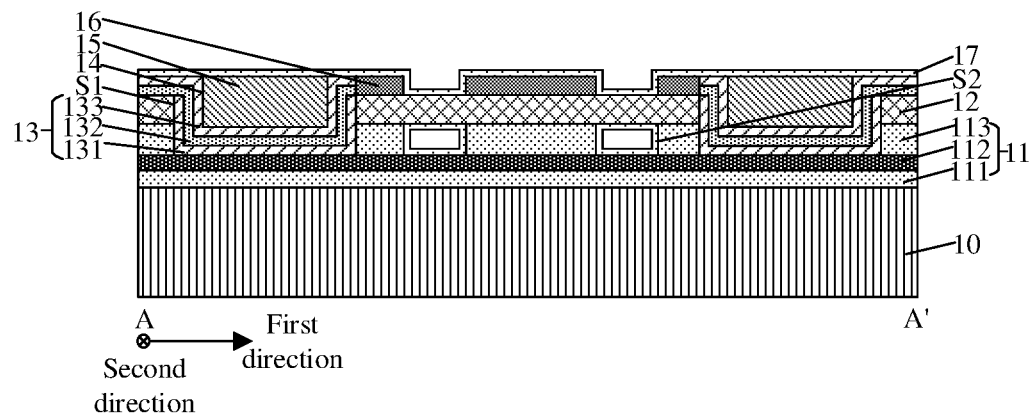
Figure 14C:
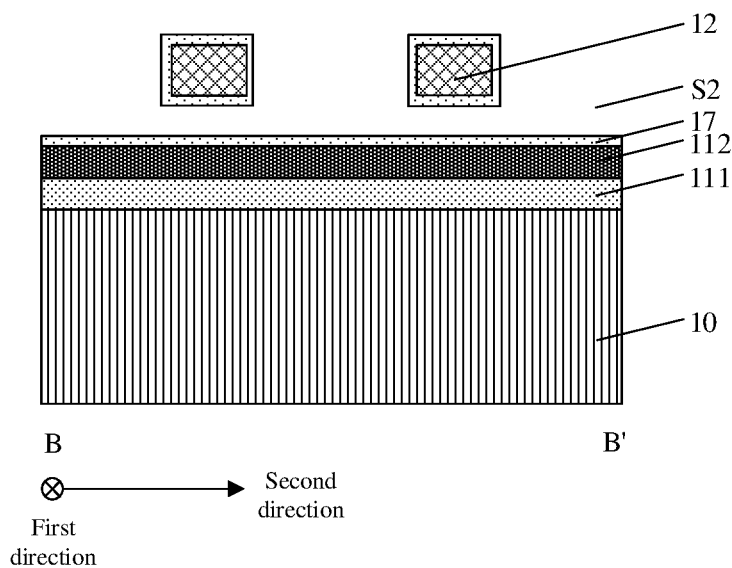

Next, as shown in FIG. 14A to FIG. 14C, the storage structure 20 further includes a fourth dielectric layer 17. Before the word line layer 18 is formed in the second groove S2, the method further includes the following operations. The fourth dielectric layer 17 is formed. The fourth dielectric layer 17 covers a surface of the channel layer 12 exposed by the second groove S2 and covers a sidewall and a bottom surface of the second groove S2, the third dielectric layer 16, and the capacitor structure 13. The fourth dielectric layer 17 is formed before the word line layer 18 is formed. The word line layer 18 is separated from the channel layer 12 by the fourth dielectric layer 17, and an upper surface of the word line layer 18 is flush with an upper surface of the fourth dielectric layer 17. In some embodiments, the fourth dielectric layer 17 also covers the filling layer 15. The fourth dielectric layer 17 may be oxide, such as silicon oxide.

Figure 16A:
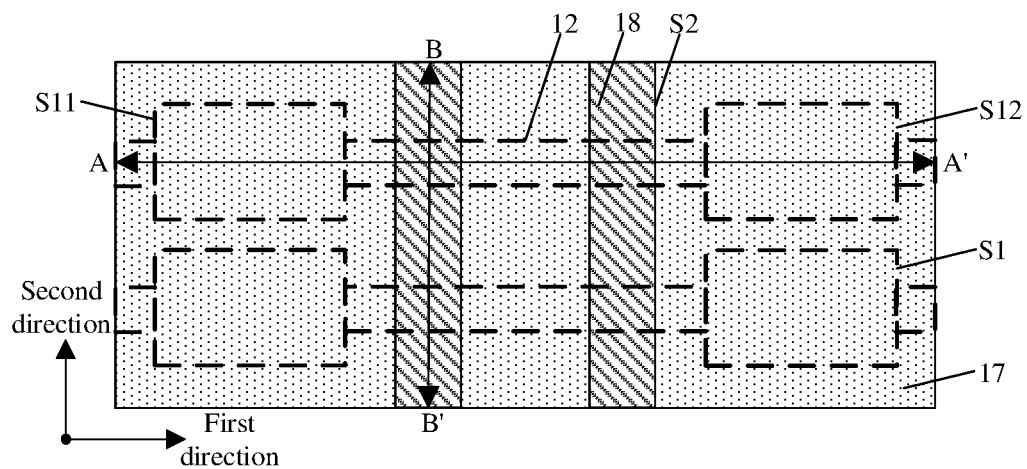
Figure 16B:
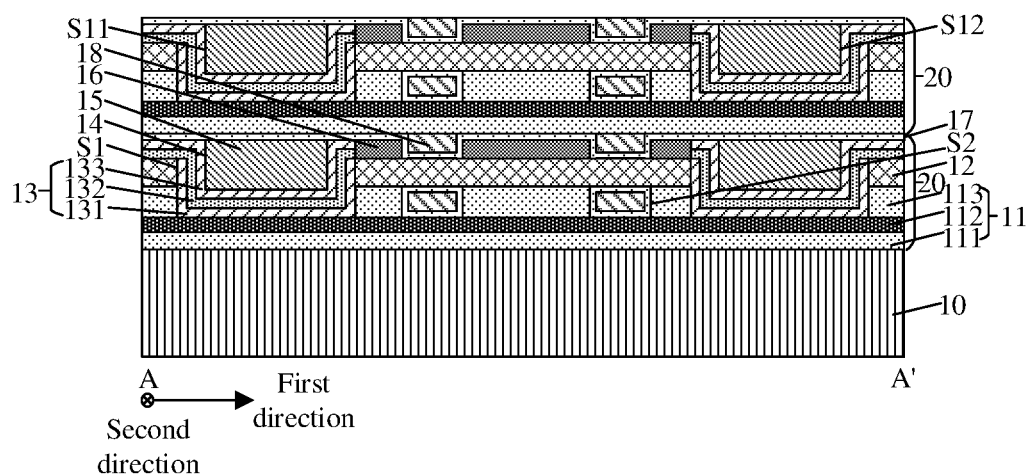
Figure 16C:
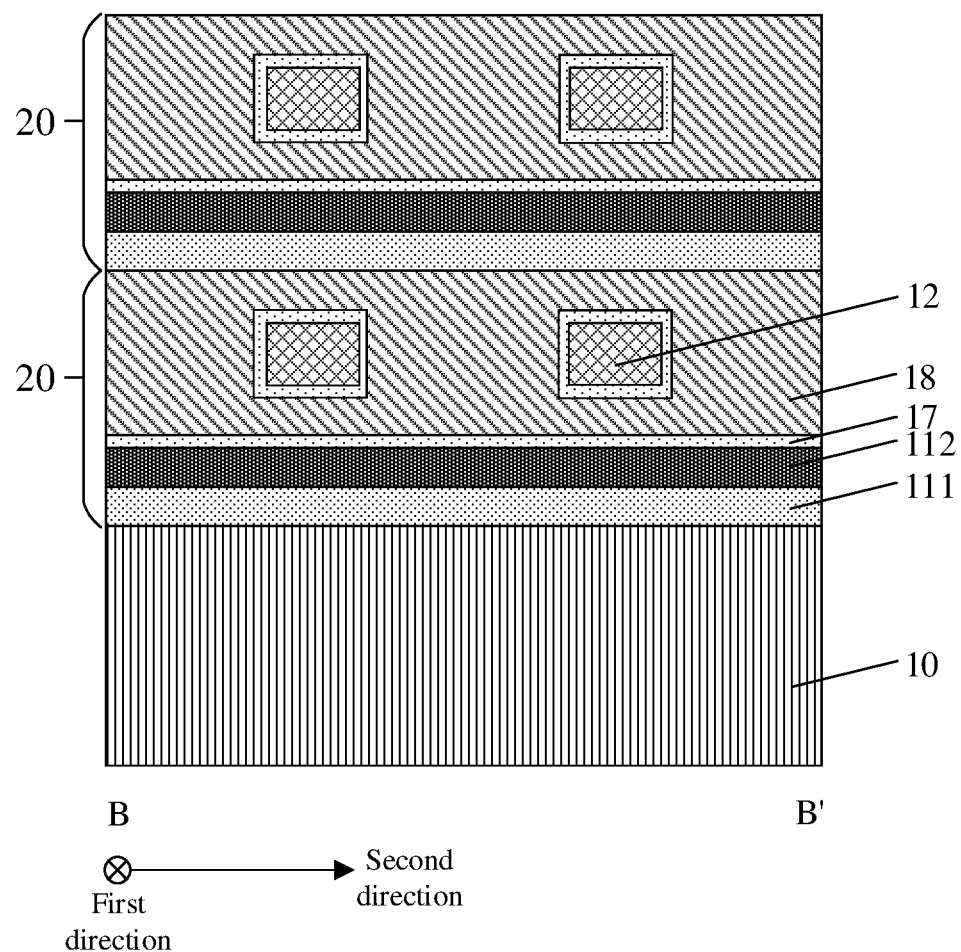

Next, S203 is performed, as shown in FIG. 16A to FIG. 16C, in which one or more other storage structures 20 is stacked on said storage structure 20.

In the embodiments of the disclosure, the plurality of storage structures 20 are stacked on the substrate 10, so that the integration and the storage density of the semiconductor device are improved.

In some embodiments, the first groove S1 has a smaller depth-to-width ratio. Thus, the process of forming the capacitor structure 13 on the sidewall and the bottom surface of the first groove S1 is simpler, compared with forming a capacitor pillar with a larger depth-to-width ratio in the related art. That is to say, the process of forming the storage structure 20 in the embodiments of the disclosure is simpler, so that it is beneficial to stack a larger number of storage structures 20 on the substrate 10, thereby increasing the storage capacity of the semiconductor device. In addition, the depth of the first groove S1 is relatively small, i.e. the height of the capacitor structure 13 is relatively small, so that more capacitor structures 13 can be accommodated per unit volume, thereby improving the integration and the storage density of the semiconductor device.

Next, after one or more other storage structures 20 are stacked on said storage structure 20, the method further includes the following operations. A plurality of storage structures 20 are etched from top to bottom to form a second trench T2. The second trench T2 extends from a topmost one of the plurality of storage structures 20 down to a bottommost one of the plurality of storage structures 20 and penetrates through the plurality of channel layers 12 in the plurality of storage structures 20. A bit line layer 19 is formed in the second trench T2, so as to finally form the structure as shown in FIG. 1A to FIG. 1C. The material of the bit line layer 19 includes one or more of tungsten (W), copper (Cu), titanium (Ti), tantalum (Ta), titanium nitride (TiN), tantalum nitride (TaN), metal silicide, or a metal alloy.

In the embodiments of the disclosure, the second trench T2 connecting the plurality of channel layers 12 is formed by one-step punching, and the bit line layer 19 is formed in the second trench T2, so that the manufacturing process of the bit line layer 19 is simplified. In some embodiments, in the first direction, one bit line layer 19 is provided between the two word line layers 18 between two adjacent first grooves S11 and S12. Thus, the two capacitor structures 13 arranged on the sidewalls and the bottom surfaces of the two adjacent first grooves S11 and S12 as well as the two adjacent word line layers 18 share one bit line layer 19, so that the manufacturing process of the semiconductor device is further simplified, and the space is saved, thereby improving the storage density of the semiconductor device.

In an embodiment, there are a plurality of bit line layers 19 arranged in the second direction, as shown in FIG. 1A. In some embodiments, the bit line layers 19 may also be arranged in an array in the first direction and in the second direction, respectively.

Embodiments of the disclosure provide a semiconductor device and a method for manufacturing a semiconductor device. The semiconductor device includes a substrate, and a plurality of storage structures stacked on the substrate. Each of the plurality of storage structures includes: a first dielectric layer; at least one channel layer arranged in the first dielectric layer and extending in a first direction, the first dielectric layer being provided with a plurality of first grooves isolating the at least one channel layer; and a capacitor structure covering a sidewall and a bottom surface of each of the plurality of first grooves. The semiconductor device provided by the embodiment of the disclosure includes a plurality of storage structures stacked on the substrate, which improves the integration and the storage density of the semiconductor device compared to a semiconductor device with a single-layer memory cell in the related art. Meanwhile, the capacitor structure provided by the embodiment of the disclosure covers the sidewall and the bottom surface of the first groove, so that the manufacturing process of the capacitor structure is simpler than a capacitor pillar with a high depth-to-width ratio in the related art.

It should be noted that those skilled in the art can change the order of the above operations without departing from the protection scope of the disclosure. The above only describes the preferred embodiments of the disclosure, and is not intended to limit the protection scope of the disclosure. Any modifications, equivalent substitution, improvements made within the spirit and principle of the disclosure shall be contained within the protection scope of the disclosure.

The invention claimed is:

1. A semiconductor device, comprising:
a substrate, and a plurality of storage structures stacked on the substrate,
each of the plurality of storage structures comprising:
a first dielectric layer;
at least one channel layer arranged in the first dielectric layer and extending in a first direction, wherein the first dielectric layer is provided with a plurality of first grooves isolating the at least one channel layer; and
a capacitor structure covering a sidewall and a bottom surface of each of the plurality of first grooves.

2. The semiconductor device according to claim 1, wherein the first dielectric layer comprises a first dielectric sub-layer, an etching barrier layer and a second dielectric sub-layer arranged from bottom to top, and the plurality of first grooves penetrate through the second dielectric sub-layer and expose the etching barrier layer.

3. The semiconductor device according to claim 1, wherein each of the plurality of storage structures comprises a plurality of channel layers, wherein the plurality of channel layers are arranged in a second direction, each of the plurality of channel layers is isolated by the plurality of first grooves, and the plurality of first grooves are arranged in the second direction.

4. The semiconductor device according to claim 3, wherein the capacitor structure comprises:
a first electrode covering the sidewall and the bottom surface of each of the plurality of first grooves;
a second dielectric layer covering the first electrode; and
a second electrode covering the second dielectric layer.

5. The semiconductor device according to claim 3, wherein each of the plurality of storage structures further comprises a third dielectric layer covering the plurality of channel layers and the first dielectric layer, wherein at least two second grooves are provided in the third dielectric layer and the first dielectric layer, each of the at least two second grooves extending in the second direction and exposing the plurality of channel layers.

6. The semiconductor device according to claim 5, wherein each of the plurality of storage structures further comprises at least two word line layers, each of the at least two word line layers extending in the second direction and arranged in a respective one of the at least two second grooves.

7. The semiconductor device according to claim 6, wherein each of the plurality of storage structures further comprises a fourth dielectric layer, wherein the fourth dielectric layer covers surfaces of the plurality of channel layers exposed by the at least two second grooves and covers a sidewall and a bottom surface of each of the at least two second grooves, the third dielectric layer, and the capacitor structure.

8. The semiconductor device according to claim 6, further comprising: at least one bit line layer extending from a topmost one of the plurality of storage structures down to a bottommost one of the plurality of storage structures and connected to the plurality of channel layers in the plurality of storage structures.

9. The semiconductor device according to claim 8, wherein in the first direction, one of the plurality of channel layers is isolated by the plurality of first grooves, two word line layers are provided between two adjacent first grooves of the plurality of first grooves, and one bit line layer is provided between the two word line layers.

10. The semiconductor device according to claim 1, wherein a material of the at least one channel layer comprises one or more of indium oxide, tin oxide, indium zinc oxide, tin zinc oxide, aluminum zinc oxide, indium gallium oxide, indium gallium zinc oxide, indium aluminum zinc oxide, indium tin zinc oxide, tin gallium zinc oxide, aluminum gallium zinc oxide, or tin aluminum zinc oxide.

11. A method for manufacturing a semiconductor device, comprising:
providing a substrate;
forming a storage structure on the substrate, wherein forming the storage structure on the substrate comprises: forming a first dielectric layer; forming, in the first dielectric layer, at least one channel layer extending in a first direction; forming, in the first dielectric layer, a plurality of first grooves isolating the at least one channel layer; and forming a capacitor structure covering a sidewall and a bottom surface of each of the plurality of first grooves; and
stacking one or more other storage structures on said storage structure.

12. The method for manufacturing the semiconductor device according to claim 11, wherein the first dielectric layer comprises a first dielectric sub-layer, an etching barrier layer and a second dielectric sub-layer, and wherein forming the first dielectric layer comprises: forming the first dielectric sub-layer; forming the etching barrier layer on the first dielectric sub-layer; and forming the second dielectric sub-layer on the etching barrier layer.

13. The method for manufacturing the semiconductor device according to claim 12, wherein the storage structure comprises a plurality of channel layers arranged in a second direction, and wherein forming the plurality of channel layers in the first dielectric layer comprises:
etching the second dielectric sub-layer to form a plurality of first trenches in the second dielectric sub-layer, wherein each of the plurality of first trenches extends in the first direction, and the plurality of first trenches are arranged in the second direction; and
forming each of the plurality of channel layers in a respective one of the plurality of first trenches.

14. The method for manufacturing the semiconductor device according to claim 13, wherein each of the plurality of channel layers is isolated by the plurality of first grooves, and the plurality of first grooves are arranged in the second direction, and wherein forming, in the first dielectric layer, the plurality of first grooves isolating each of the plurality of channel layers comprises: etching the plurality of channel layers and the second dielectric sub-layer from top to bottom to expose the etching barrier layer to form the plurality of first grooves.

15. The method for manufacturing the semiconductor device according to claim 14, wherein the capacitor structure comprises a first electrode, a second dielectric layer and a second electrode, and wherein forming the capacitor structure comprises:

forming the first electrode in each of the plurality of first grooves, wherein the first electrode covers the sidewall and the bottom surface of each of the plurality of first grooves;

forming a second dielectric material layer on the first dielectric layer, the plurality of channel layers and the first electrode, and forming a second electrode material layer on the second dielectric material layer; and removing a portion of the second electrode material layer to form the second electrode, and removing a portion of the second dielectric material layer to form the second dielectric layer, wherein the second electrode and the second dielectric layer cover the first electrode.

16. The method for manufacturing the semiconductor device according to claim 14, wherein the storage structure further comprises a third dielectric layer, and a second groove extending in the second direction, and wherein after forming the capacitor structure, the method further comprises:

forming the third dielectric layer on the plurality of channel layers and on the first dielectric layer; and removing a portion of the first dielectric layer and a portion of the third dielectric layer to form the second groove in the first dielectric layer and the third dielectric layer, wherein the second groove exposes the plurality of channel layers.

17. The method for manufacturing the semiconductor device according to claim 16, wherein the storage structure further comprises a word line layer extending in the second direction, and wherein after forming the second groove, the method further comprises:

forming the word line layer in the second groove.

18. The method for manufacturing the semiconductor device according to claim 17, wherein the storage structure further comprises a fourth dielectric layer, and wherein before forming the word line layer in the second groove, the method further comprises:

forming the fourth dielectric layer, wherein the fourth dielectric layer covers surfaces of the plurality of channel layers exposed by the second groove and covers a sidewall and a bottom surface of the second groove, the third dielectric layer, and the capacitor structure.

19. The method for manufacturing the semiconductor device according to claim 18, wherein after stacking one or more other storage structures on said storage structure, the method further comprises:

etching a plurality of storage structures from top to bottom to form a second trench, wherein the second trench extends from a topmost one of the plurality of storage structures down to a bottommost one of the plurality of storage structures and penetrates through the plurality of channel layers in the plurality of storage structures; and forming a bit line layer in the second trench.

* * * * *